US005850350A

United States Patent [19]
Shibuya et al.

[11] Patent Number: 5,850,350
[45] Date of Patent: Dec. 15, 1998

[54] APPARATUS FOR DETERMINING INITIAL ARRAY OF INTEGRATED CIRCUIT

[75] Inventors: Toshiyuki Shibuya; Izumi Nitta, both of Kanagawa, Japan

[73] Assignee: Fujitsu Limited, Kawasaki, Japan

[21] Appl. No.: 701,769

[22] Filed: Aug. 26, 1996

[30] Foreign Application Priority Data

Aug. 28, 1995 [JP] Japan .................................. 7-218393

[51] Int. Cl.⁶ ............................................. G06F 17/50
[52] U.S. Cl. ........................................ 364/491; 364/488
[58] Field of Search .................................. 364/488, 489, 364/490, 491

[56] References Cited

U.S. PATENT DOCUMENTS

| | | | |
|---|---|---|---|
| 3,617,714 | 11/1971 | Kernighan et al. | 364/488 |
| 4,577,276 | 3/1986 | Dunlop et al. | 364/491 |
| 4,908,772 | 3/1990 | Chi | 364/491 |
| 5,341,308 | 8/1994 | Mendel | 364/489 |
| 5,579,237 | 11/1996 | Shibuya | 364/491 |
| 5,583,788 | 12/1996 | Kuribayashi | 364/490 |
| 5,659,717 | 8/1997 | Tse et al. | 395/500 |

OTHER PUBLICATIONS

Breuer, "A Class of Min–Cut Placement Algorithms," Proceedings of the 14th Annual Design Automation Conference, pp. 284–290, 1977.

*Primary Examiner*—Kevin J. Teska
*Assistant Examiner*—Leigh Marie Garbowski
*Attorney, Agent, or Firm*—Armstrong, Westerman, Hattori, McLeland, & Naughton

[57] ABSTRACT

In addition to cell size sums $C_a$ and $C_b$ as a restrictive condition to well balance the cell sizes in two divided areas $D_A$ and $D_B$, net cell sizes $N_a$ and $N_b$ are taken into consideration by replacing the number of nets with a cell size under a restrictive condition in executing a mini-cut method. That is, the mini-cut method is performed under a restrictive condition that the integrated cell size obtained by adding the cell sizes $C_a$ and $C_b$ to the net cell sizes $N_a$ and $N_b$ is well balanced in both divided areas.

27 Claims, 30 Drawing Sheets

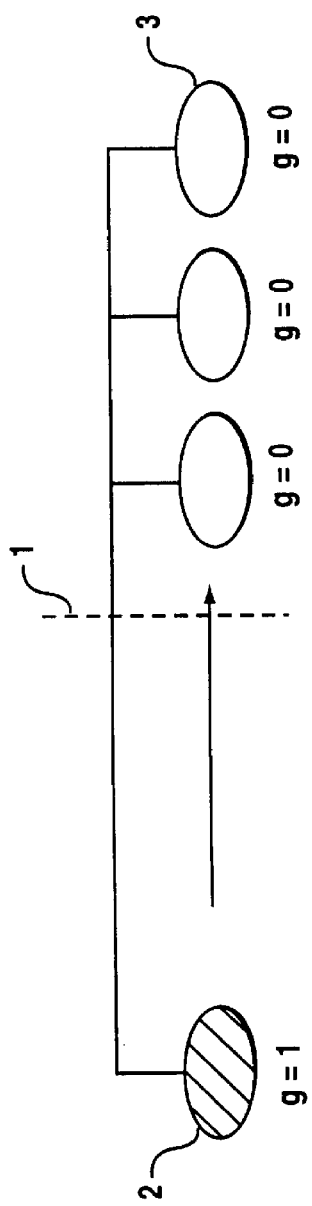
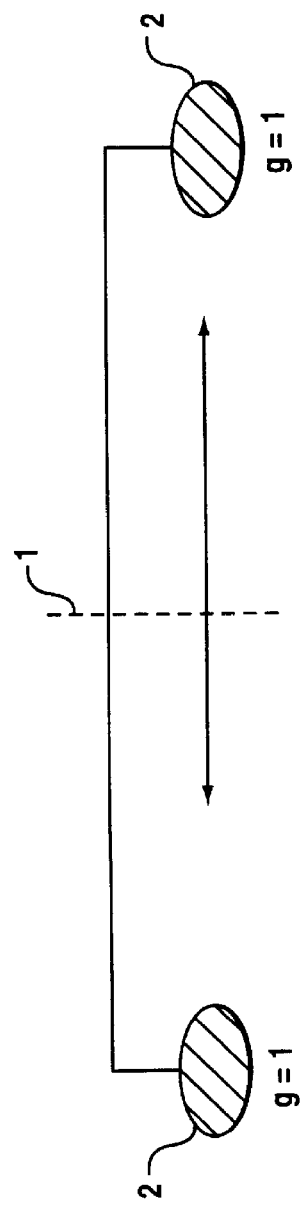
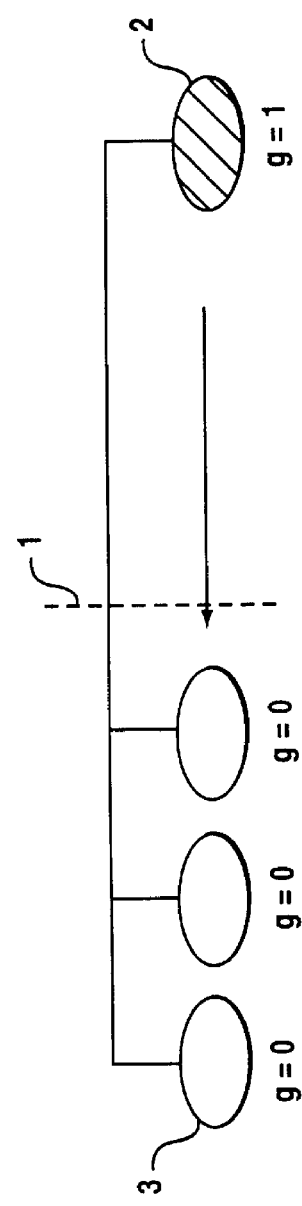
FIG.2A PRIOR ART
FIG.2B PRIOR ART
FIG.2C PRIOR ART

FIG.24

CELL TABLE 110

| CELL NUMBER | CELL SIZE | NUMBER OF TERMINALS | POSITION |
|---|---|---|---|
| 1 | 1 | 8 | DA |
| 2 | 1 | 8 | DA |
| 3 | 1 | 9 | DA |
| 4 | 1 | 3 | DA |
| 5 | 1 | 1 | DB |
| 6 | 1 | 3 | DB |
| 7 | 1 | 7 | DB |
| 8 | 3 | 3 | DB |

FIG.26

NET TABLE 120

| NET NUMBER | CELL COUNT A | CELL COUNT B |
|---|---|---|
| 1 | 2 | 0 |
| 2 | 2 | 0 |
| 3 | 2 | 0 |
| 4 | 2 | 0 |
| 5 | 2 | 0 |
| 6 | 2 | 0 |
| 7 | 2 | 0 |
| 8 | 2 | 0 |
| 9 | 2 | 0 |
| 10 | 2 | 0 |
| 11 | 2 | 0 |
| 12 | 2 | 0 |
| 13 | 2 | 0 |
| 14 | 1 | 1 |
| 15 | 1 | 1 |
| 16 | 0 | 2 |
| 17 | 0 | 2 |
| 18 | 0 | 2 |
| 19 | 0 | 2 |

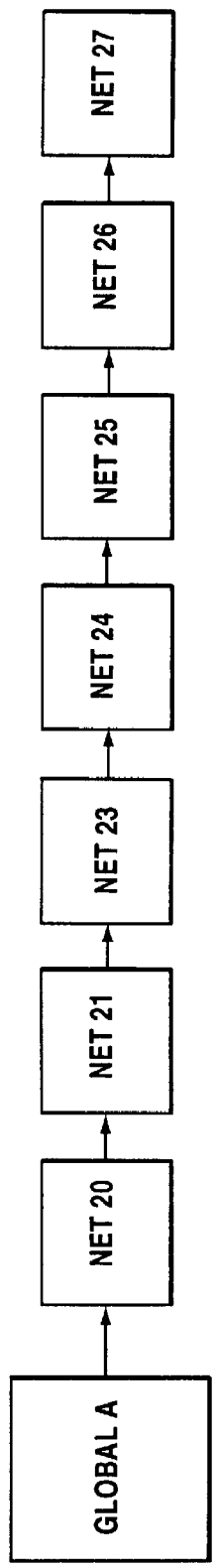
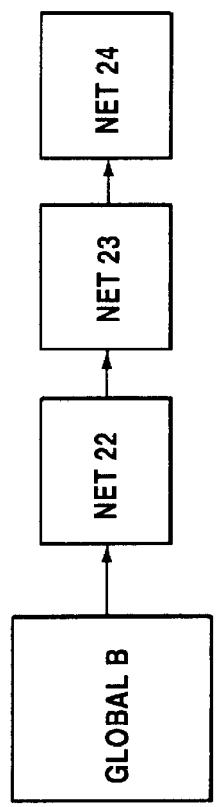
FIG.29A
FIG.29B

APPARATUS FOR DETERMINING INITIAL ARRAY OF INTEGRATED CIRCUIT

BACKGROUND OF THE INVENTION

1. Field of the Invention

The present invention relates to an initial array determining apparatus for an integrated circuit for determining the array of a plurality of cells forming an integrated circuit such as an LSI, VLSI, ULSI, etc., and more specifically to an initial array determining apparatus for an integrated circuit for optimizing the cell array of an integrated circuit using a mini-cut method.

2. Description of the Related Art

With recent rapid development of manufacturing technology, integrated circuits have been remarkably improved in integration degree and circuit scale, and the number of cells contained in an integrated circuit chip becomes larger and larger. Therefore, it becomes harder to obtain an optimum solution to a cell array problem.

A partitioning method is one of the well-known methods of determining the initial array of integrated circuit cells. The partitioning method aims at minimizing the number of net elements, that is, the number of cuts, between blocks by dividing a given circuit into K (natural number) portions (blocks). The typical algorithm of the partitioning method is the mini-cut method.

According to the mini-cut method, the horizontal and vertical cut lines and the process order are determined, and a logical division is sequentially performed on each cut line, thereby determining the array. At this time, the cut lines may be set on the boundaries of all blocks.

When the process order of the cut lines is determined, the area on the chip (a set of blocks) is determined for each cut line. Furthermore, the condition of the number of cells in the division is determined depending on the point of the cut line (the upper limit of $M_1$ and $M_2$ when a cell set M is divided into $M_1$ and $M_2$). The logical division is performed such that the number of the lines (net) passing on the cut line can be minimized. At this time, the division should be performed in a way that it meets the condition of the number of cells.

Thus, the mini-cut method basically refers to reducing the number of nets across the cut line by moving a cell arranged in a block to another block.

FIG. 1 is an operating flowchart showing the conventional mini-cut method.

First, the initial cell array and cut line are determined (S1). Then, a cell gain is determined for each cell (S2). The cell gain indicates the number of cuts reduced when a cell is moved to another block.

Then, cell gains g are sorted in a descending order for each block (S3). Then, the cell having the largest cell gain g is selected from the block having the largest cell size. The selected cell is moved to another block (S4).

Next, the cell gains of the moved cell and the cell connected to the moved cell through a net are updated, and the cell gains g are re-sorted for each block (S5). Then, it is determined whether or not there is a positive cell gain g (S6). If yes in S6, the processes in steps S4 and S5 are repeated. If it is determined that no cell gains g exist (no in S6), the process terminates.

Through the above described processes, the initial cell array can be optimized.

The above described mini-cut method is practically described below by referring to FIGS. 2A through 2C.

In FIGS. 2A through 2C, a vertical line 1 indicated by broken lines is a cut line. A cell 2 indicated as a shadowed oval portion has a positive cell gain g. A Cell 3 indicated by a non-shadowed oval portion has a cell gain g of '0'.

With the cell array shown in FIGS. 2A through 2C, the number of cuts can be reduced by moving the shadowed cell 2 to another block across the cut line 1. When the cell is actually moved, consideration should be made such that the ratio of the area size of a block to the total area sizes of the cells in the block is well balanced in each block.

The result of dividing a block using the above described conventional mini-cut method indicates an acceptable optimization in number of cuts. However, for example, the net congestion, terminal density, etc. are not always equal between the two divided areas.

FIG. 3 shows the congestion of the net in each area by generating a minimum spanning tree in all nets in response to the results of the arrays obtained by applying the conventional mini-cut method to an integrated circuit 5. In this case, the initial cut is performed horizontally at the center of the integrated circuit 5.

In FIG. 3, a curve 6 on the left of the integrated circuit 5 indicates the congestion of the net. As shown in FIG. 3, the congestion of the net is sufficiently reduced around the center of the integrated circuit with its initial cut. However, in comparing the congestion with those in the upper and lower divided areas, the congestion peak is detected at the center of the upper area as indicated by a horizontal line 7 around which a lot of unconnected lines may be detected. The connection rate is Lower at a point where the terminal density is higher.

SUMMARY OF THE INVENTION

The present invention aims at raising the connection rate in an integrated circuit initial array system.

The initial array determining apparatus according to the present invention comprises a cell size computing unit, a net cell size computing unit, and a mini-cut method executing unit. The cell size computing unit computes the sums $C_a$ and $C_b$ of the cell sizes contained respectively in the areas $D_A$ and $D_B$ divided by a cut line. The net cell size computing unit obtains the sums of the nets contained respectively in the areas $D_A$ and $D_B$ divided by the cut line and outputs them as net cell sizes $N_a$ and $N_b$. The mini-cut method executing unit performs the mini-cut method under the restrictive conditions that the respective total of the above described cell size sums and net cell size is well balanced for the above described two divided areas $D_A$ and $D_B$ based on the computation results from the cell size computing unit and net cell size computing unit.

The mini-cut method executing unit computes the average feedthrough area θ divided by the cut line and the area sizes A and B of the above described two divided areas $D_A$ and $D_B$, and performs the mini-cut method such that the restrictive conditions represented by the following equation (1) may be satisfied.

$$\frac{C_a + \theta \cdot N_a}{A} - \frac{C_b + \theta \cdot N_b}{B} \leq \epsilon \tag{1}$$

($\in$ indicates a very small value compared with the sum of the area sizes A and B of the two divided areas $D_A$ and $D_B$)

Using the above described initial array determining apparatus according to the present invention, the mini-cut method is performed in consideration of not only the cell sizes $C_a$ and $C_b$, but also the net cell sizes $N_a$ and $N_b$ obtained by replacing the number of nets with cell sizes under the restrictive condition that the integral cell size obtained by adding up the cell sizes $N_a$ and $N_b$ and the net cell size $N_a$ and $N_b$ is well balanced in both divided areas.

Therefore, since the cells are arranged such that the net congestion is levelled among the divided areas, the connection rate of the integrated circuit is improved.

BRIEF DESCRIPTION OF THE DRAWINGS

FIGS. 2A through 2C show the method of moving a cell by the conventional mini-cut method;

FIG. 24 shows the structure of the data on the table storing the information, which is used in the mini-cut method according to the second initial array determining apparatus according to the present invention, about the cells contained in the circuit shown in FIG. 16;

FIG. 26 shows the structure of the data on the table storing the information, which is used in the mini-cut method according to the third initial array determining apparatus according to the present invention, about the cells contained in the circuit shown in FIG. 16;

FIGS. 29A and 29B show the structure of the data on the list of the general line connection in the circuit shown in FIG. 28 used in the mini-cut method performed by the above described fourth initial array determining apparatus;

DESCRIPTION OF THE PREFERRED EMBODIMENTS

Figure 1:
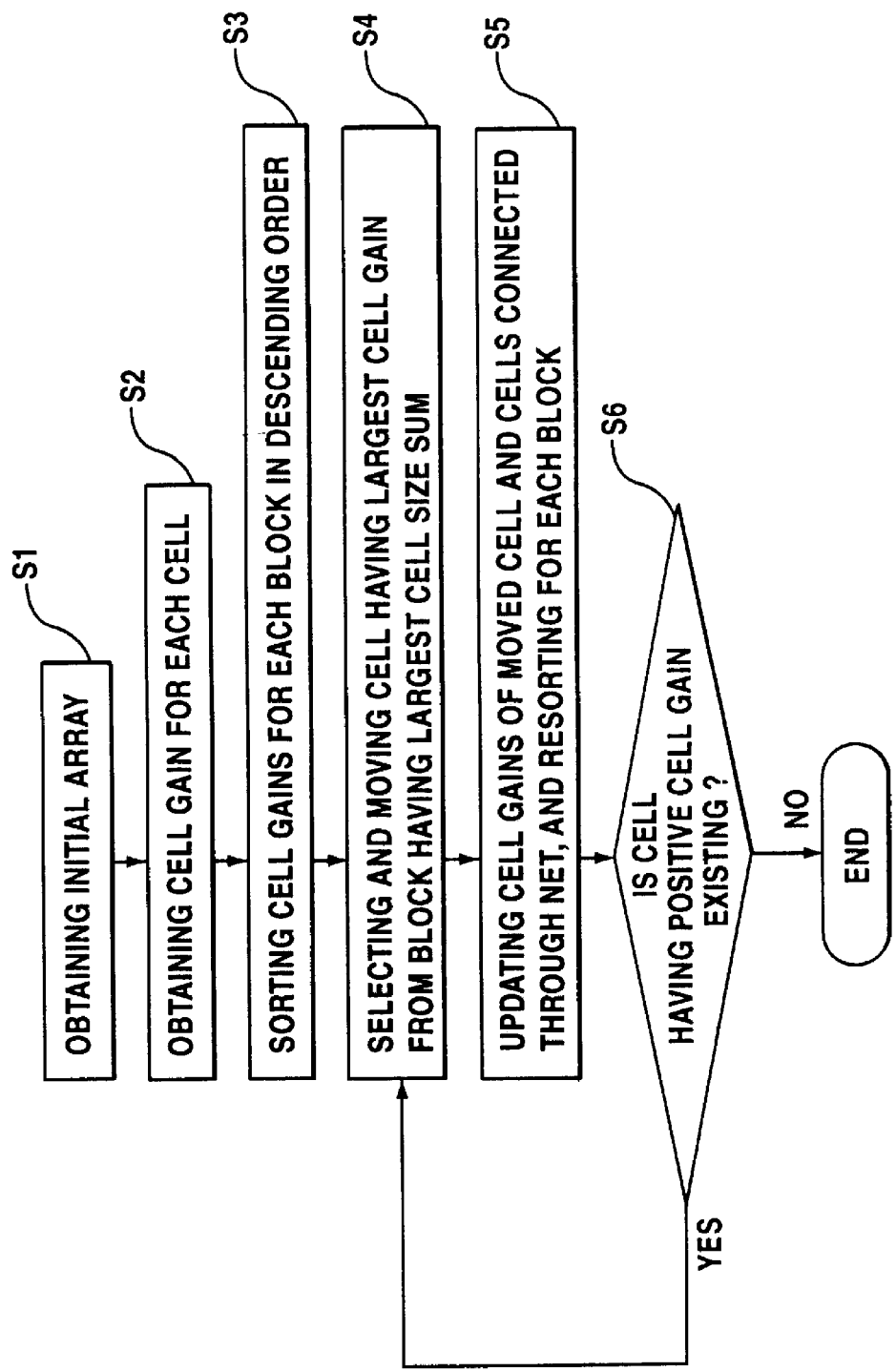
FIG. 1 is an operating flowchart showing the conventional mini-cut method.

The embodiment of the initial array determining apparatus according to the present invention is described below by referring to the drawings.

The initial array determining apparatus of the present invention improves the connection rate while optimizing the number of cuts by the mini-cut method, balancing not only the sum of the sizes of the cells contained in the divided areas in the integrated circuit but also the sizes of the nets contained in the divided areas and the terminal density.

Figure 4:
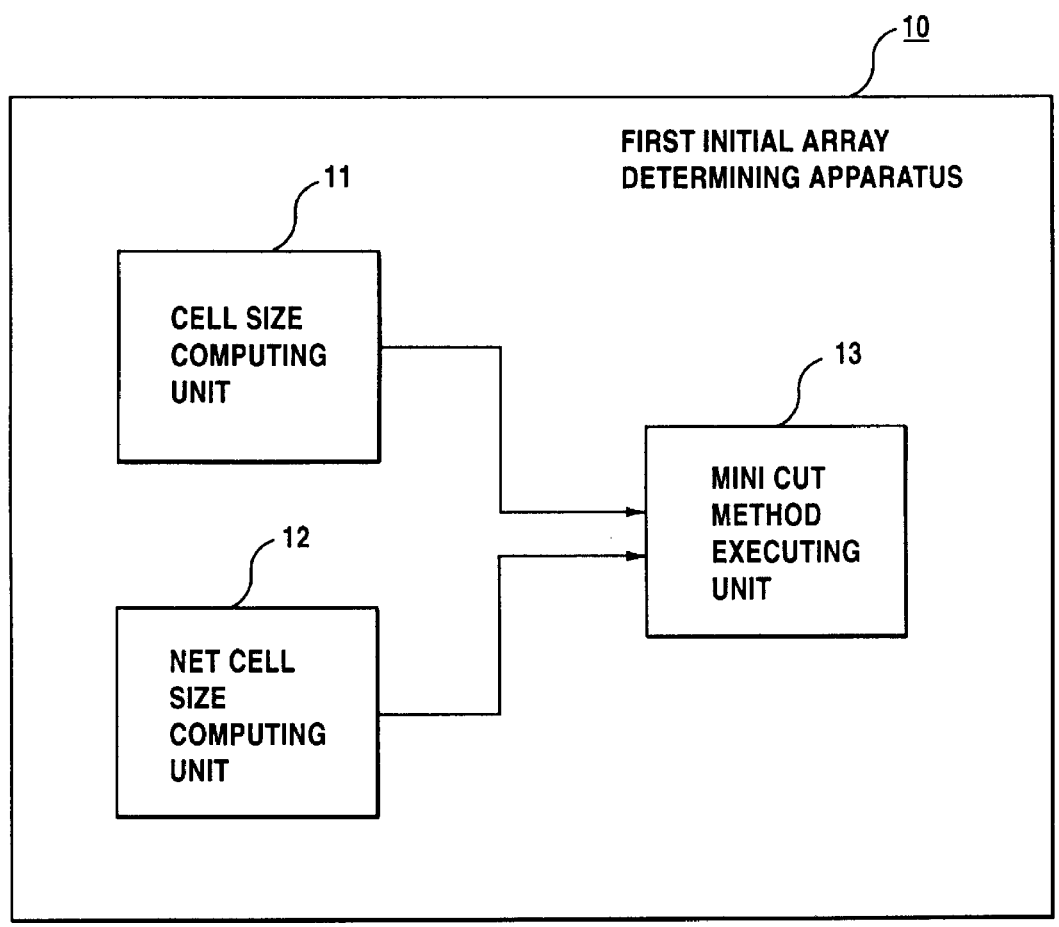
FIG. 4 is a block diagram showing the configuration of the first initial array determining apparatus according to the present invention.

FIG. 4 is a block diagram showing the configuration of a first initial array determining apparatus 10 according to the present invention.

The first initial array determining apparatus 10 determines the initial array of cells forming an integrated circuit by setting cut lines in the area of the integrated circuit and repeating a cell shifting operation among the areas divided by the cut lines such that the number of cuts, that is, the number of connections lines, cut by the cut lines can be minimized.

The above described first initial array determining apparatus 10 comprises a cell size computing unit 11, net cell size computing unit 12, and mini-cut method executing unit 13.

The cell size computing unit 11 computes the sums $C_a$ and $C_b$ of the sizes of the cells contained in the areas $D_A$ and $D_B$ divided by the cut line.

The net cell size computing unit 12 obtains the sum of the nets contained in the areas $D_A$ and $D_B$ divided by the cut lines, and computes them as the net cell sizes $N_a$ and $N_b$.

The mini-cut method executing unit 13 performs the mini-cut method under the restrictive conditions that the respective total of the cell size sums and the above described net cell sizes is well balanced for the above described two divided areas $D_A$ and $D_B$ based on the computation results from the cell size computing unit 11 and net cell size computing unit 12.

Figure 5:
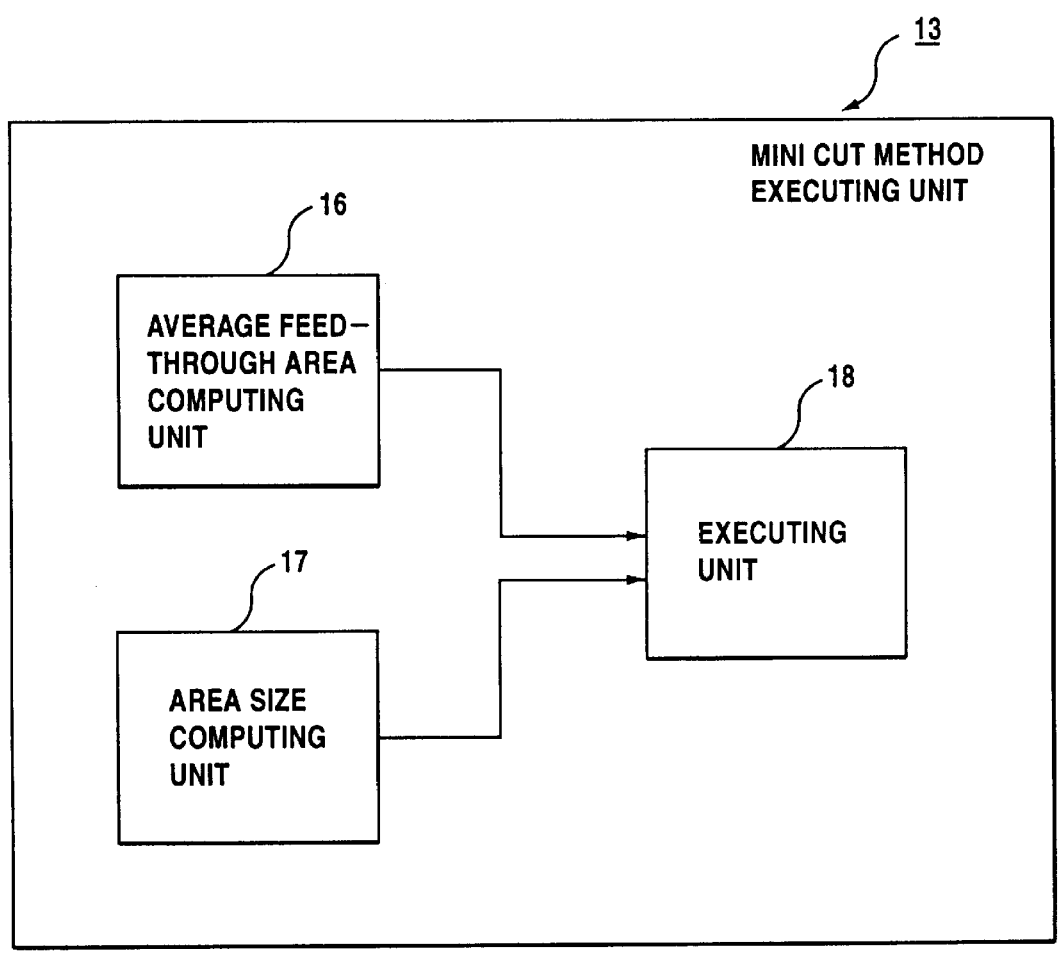
FIG. 5 shows an example of the configuration of the mini-cut method executing unit shown in FIG. 4.

FIG. 5 shows an example of the configuration of the mini-cut method executing unit 13.

The mini-cut method executing unit 13 comprises an average feedthrough area computing unit 16, an area size computing unit 17, and an executing unit 18.

The average feedthrough area computing unit 16 computes the average feedthrough area θ of the area divided by the cut line.

The area size computing unit 17 computes the area sizes A and B of the two divided areas $D_A$ and $D_B$.

The executing unit 18 performs the mini-cut method so that the restrictive conditions represented by, for example, the following equation (1) can be satisfied using the calculation results from the area size computing unit 17 and average feedthrough area computing unit 16.

$$\frac{C_a + \theta \cdot N_a}{A} - \frac{C_b + \theta \cdot N_b}{B} \leq \epsilon \quad (1)$$

For example, the average feedthrough area computing unit 16 computes the effective feedthrough γ of the area divided by the cut line by, for example, the following equation (2).

$$\gamma = \frac{C_a + C_b}{A + B} \quad (2)$$

Then, it computes the average feedthrough area θ by, for example, the following equation (3).

$$\theta = \frac{\lambda(1 - \gamma)(A + B)}{N_{all}} \quad (3)$$

where λ indicates the effective feedthrough use rate. The value of λ is normally 0.7 through 0.85 because the free area storing no cells is not completely used as feedthrough.

Furthermore, the above described $N_{all}$ indicates the sum of nets contained in the area of the integrated circuit. Assuming that the number of the nets cut (cut size) by the cut line is $N_{cut}$, the net currently being cut is counted for $N_a$ and $N_b$ and the following equation is set.

$$N_{all} = N_a + N_b - N_{cut}$$

The conventional mini-cut method has been performed under the restrictive conditions that the following equation (4) can be satisfied assuming that ∈ is an extremely small value in comparison with the sum of the sizes A and B respectively of the above described two divided areas $D_A$ and $D_B$.

$$\frac{C_a}{A} - \frac{C_b}{B} < \epsilon \quad (4)$$

Using the first initial array determining apparatus 10, the mini-cut method is performed in consideration of not only the cell sizes $C_a$ and $C_b$, but also the net cell sizes $N_a$ and $N_b$ obtained by replacing the number of nets with cell sizes under the restrictive condition that the integral cell size obtained by adding up the cell sizes $N_a$ and $N_b$ and the net cell size $N_a$ and $N_b$ is well balanced in both divided areas.

Since the restrictive condition $\theta \cdot N_a$ and $\theta \cdot N_b$ associated with the sum (net cell sizes) of the nets is added to the restrictive condition $C_a$ and $C_b$ of the sums of the cell sizes to balance the cell sizes in the two divided areas $D_A$ and $D_B$, the cell use rate of the area in which a net congestion is detected can be dynamically controlled. As a result, the net congestion in the entire integrated circuit can be levelled.

Therefore, since cells are arrayed such that the net congestion can be levelled in each of the divided areas, the connection rate in the integrated circuit can be improved.

Figure 6:
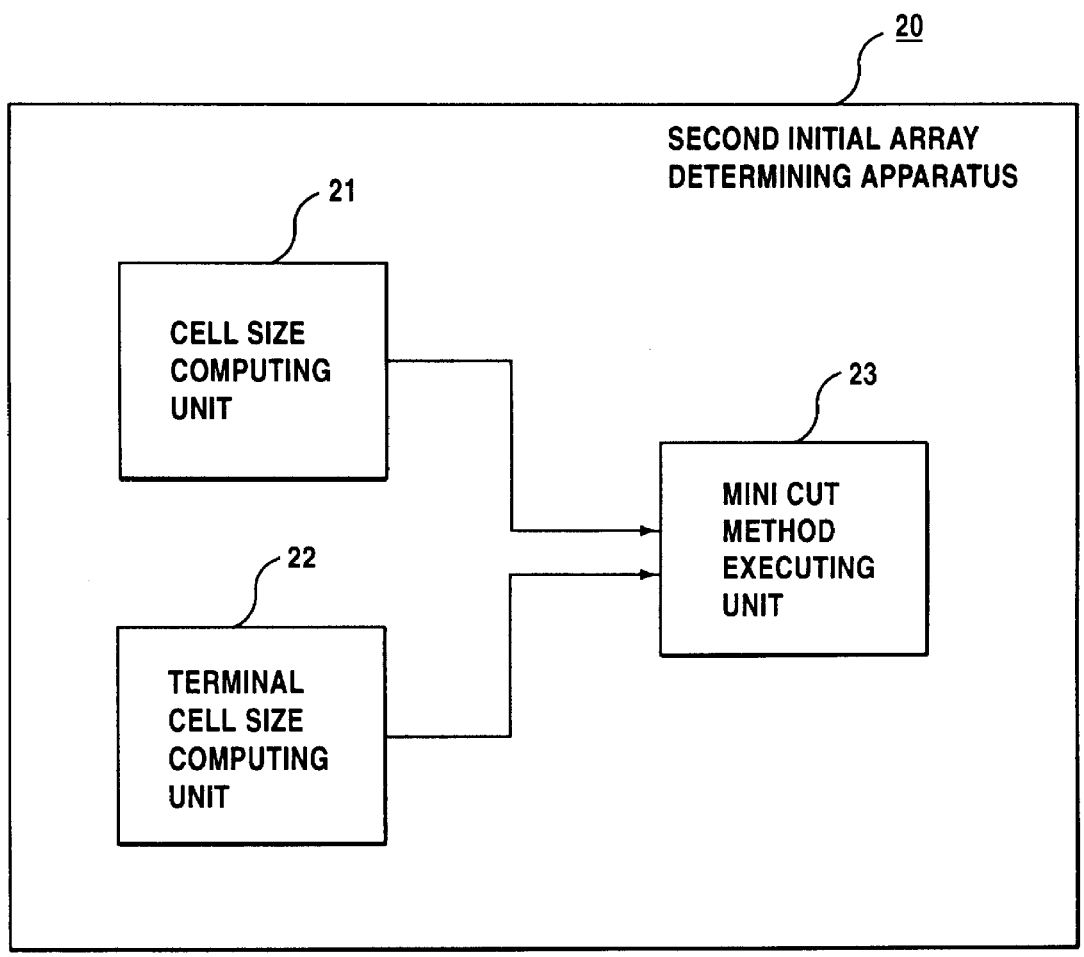
FIG. 6 is a block diagram showing the configuration of the second initial array determining apparatus according to the present invention.

FIG. 6 is a block diagram showing the configuration of a second initial array determining apparatus 20.

The second initial array determining apparatus 20 determines the initial array of cells forming an integrated circuit by setting cut lines in the area of the integrated circuit and repeating a cell shifting operation among the areas divided by cut lines such that the number of cuts, that is, the number of connection lines, cut by the cut lines can be minimized.

The above described second initial array determining apparatus 20 comprises a cell size computing unit 21, terminal cell size computing unit 22, and mini-cut method executing unit 23.

The cell size computing unit 21 computes the sums $C_a$ and $C_b$ of the sizes of the cells contained in the $D_A$ and $D_B$ divided by the cut line.

The terminal cell size computing unit 22 obtains the sum of the terminals of all cells contained in the areas $D_A$ and $D_B$ divided by the cut lines, and computes them as the terminal cell sizes $P_a$ and $P_b$.

The mini-cut method executing unit 23 performs the mini-cut method under the restrictive conditions that the respective total of the cell size sums and the above described terminal cell sizes is well balanced for the above described two divided areas $D_A$ and $D_B$ based on the computation results from the cell size computing unit 21 and terminal cell size computing unit 22.

Figure 7:
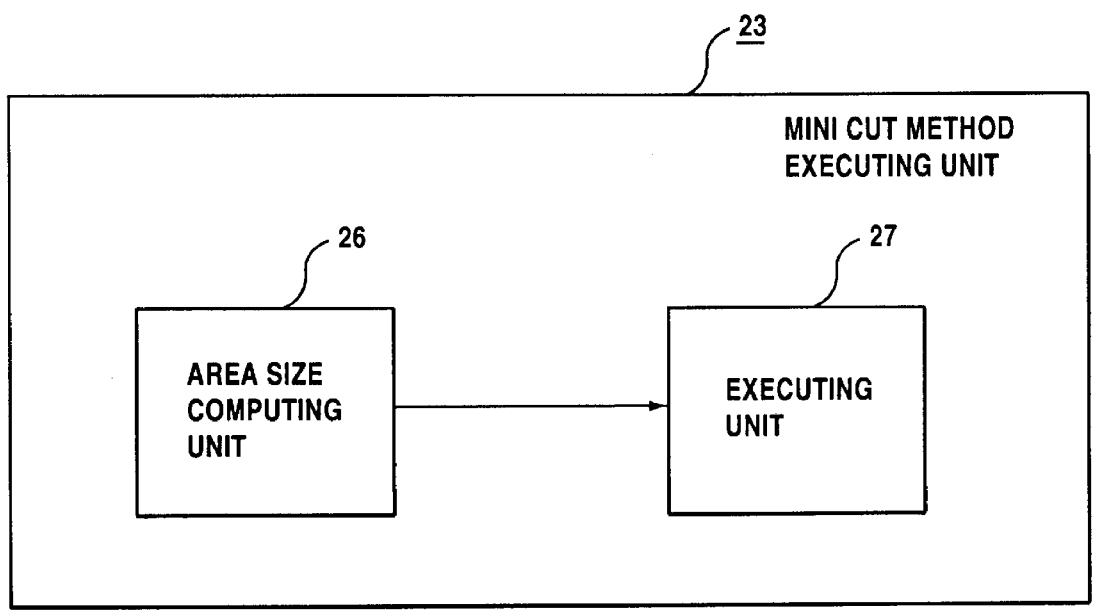
FIG. 7 shows an example of the configuration of the mini-cut method executing unit shown in FIG. 6.

FIG. 7 shows an example of the configuration of the mini-cut method executing unit 23.

In FIG. 7, an area computing unit 26 computes the area sizes A and B of the above described two divided areas $D_A$ and $D_B$.

Using the computation result obtained by the area size computing unit 26, an executing unit 27 performs the mini-cut method such that the restrictive condition represented by, for example, the following equation (5) can be satisfied.

$$\frac{C_a + \alpha \cdot P_a}{A} - \frac{C_b + \alpha \cdot P_b}{B} \leq \epsilon \quad (5)$$

(where α indicates the weight of the terminal congestion)

With the increased value of 'α' indicating the weight of the terminal congestion, the weight of the terminal congestion becomes larger than the restricted value of the cell area size.

The α is in the range from 0.1 to 10.

Using the second initial array determining apparatus 20, the mini-cut method is performed in consideration of not only the cell sizes $C_a$ and $C_b$, but also the terminal cell sizes $P_a$ and $P_b$ obtained by replacing the number of terminals with cell sizes under the restrictive condition that the integral cell size obtained by adding up the cell sizes $C_a$ and $C_b$ and the terminal cell sizes $P_a$ and $P_b$ is well balanced in both divided areas.

Since the restrictive condition $\alpha \cdot P_a$ and $\alpha \cdot P_b$ associated with the sum (terminal cell sizes) of the terminals is added to the restrictive condition $C_a$ and $C_b$ of the sums of the cell sizes to balance the cell sizes, the cell use rate of the area in which a terminal congestion is detected can be dynamically controlled.

Therefore, as a result, since cells are arrayed such that the terminal congestion can be levelled in each of the divided areas, the connection rate in the integrated circuit can be improved.

The above described first initial array determining apparatus 10 directly controls the restrictive condition using the number of nets contained in the divided areas $D_A$ and $D_B$. In this method, a desired cell array can be obtained if the number of cells connected to a net does not greatly change in the integrated circuit. However, if the integrated circuit contains a power driver capable of driving a lot of cells in a single output process, then the number of cells connected to a net greatly changes.

To solve the problem, a third initial array determining apparatus 30 of the present invention described below assigns a weight to a net to which a lot of cells are connected.

Figure 8:
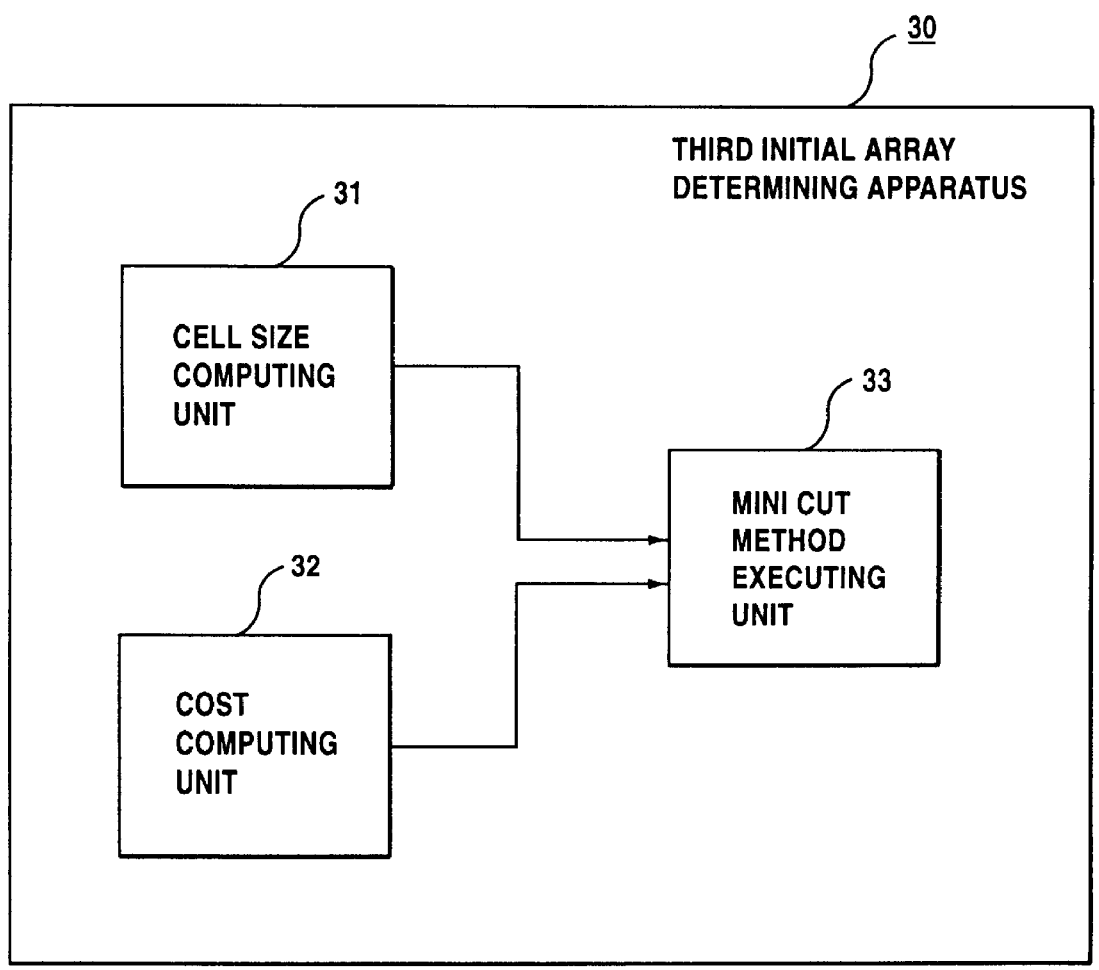
FIG. 8 is a block diagram showing the configuration of the third initial array determining apparatus according to the present invention.

FIG. 8 is a block diagram showing the configuration of the third initial array determining apparatus 30.

The third initial array determining apparatus 30 determines the initial array of cells forming an integrated circuit by setting cut lines in the area of the integrated circuit and repeating a cell shifting operation among the areas divided by the cut lines such that the number of cuts, that is, the number of connections lines, cut by the cut lines can be minimized.

The third initial array determining apparatus 30 comprises a cell size computing unit 31, cost computing unit 32, and mini-cut method executing unit 33.

The cell size computing unit 31 computes the sums $C_a$ and $C_b$ of the sizes of the cells contained in the $D_A$ and $D_B$ divided by the cut line.

The cost computing unit 32 computes the congestion cost $CosT_a$ and $CosT_b$ of the net contained in the areas $D_A$ and $D_B$ divided by the cut lines, and computes them as the net cell sizes $N_a$ and $N_b$.

The mini-cut method executing unit 33 performs the mini-cut method under the restrictive conditions that the respective total of the cell size sums and the above described net congestion cost is well balanced for the above described two divided areas $D_A$ and $D_B$ based on the computation results from the cell size computing unit 31 and cost computing unit 32.

Figure 9:
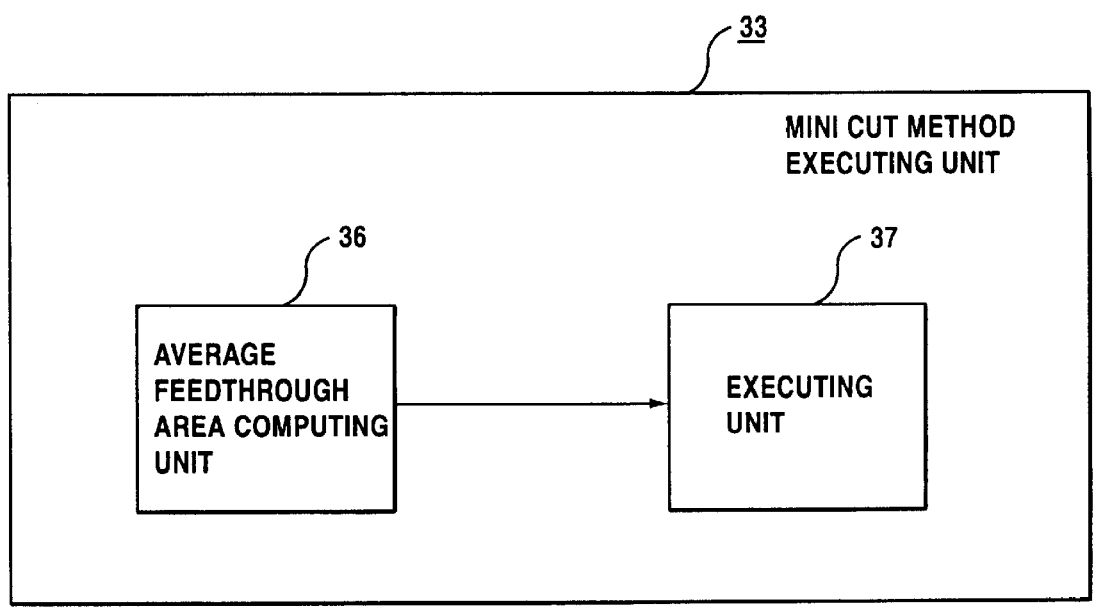
FIG. 9 shows an example of the configuration of the mini-cut method executing unit shown in FIG. 8.

FIG. 9 shows an example of the configuration of the mini-cut method executing unit 33 shown in FIG. 8.

The mini-cut method executing unit 33 comprises an average feedthrough area computing unit 36 and an executing unit 37.

The average feedthrough area computing unit 36 computes the average feedthrough area $\theta$ of the area divided by the cut line.

The executing unit 37 performs the mini-cut method such that the restrictive condition represented by the following equation (6) may be satisfied.

$$\left| \frac{C_a + \theta \cdot CosT_a}{A} - \frac{C_b + \theta \cdot CosT_b}{B} \right| \leq \epsilon \tag{6}$$

The average feedthrough area computing unit 36 computes the usage rate $\gamma$ of the area divided by the cut line by, for example, the following equation (7).

$$\gamma = \frac{C_a + C_b}{A + B} \tag{7}$$

Then, it computes the average feedthrough area $\theta$ by, for example, the following equation (8).

$$\theta = \frac{\lambda(1 - \gamma)(A + B)}{N_{all}} \tag{8}$$

Assuming that, for example, the number of cells connected to the net $NA_i$ ($i=1, 2, \ldots, N_a$) contained in the divided area $D_A$, and contained in the divided area $D_A$ is $C_{NAi}$, and that the number of cells connected to the net $NB_i$ ($i=1, 2, \ldots, N_a$) contained in the divided area $D_B$, and contained in the divided area $D_B$ is $C_{NBi}$, the cost computing unit 32 computes the cost $COST_a$ by the following equation (9).

$$CosT_a = \sum_{i=1}^{N_a} f(C_{NAi}) \tag{9}$$

It also computes the $CosT_b$ by the following equation (10).

$$CosT_b = \sum_{i=1}^{N_a} f(C_{NBi}) \tag{10}$$

For example, the function f(x) is represented by the following equation.

$$f(x) = \log x$$

where $x = C_{NAi}, C_{NBi}$

Furthermore, the function f(x) is also represented by the following equation.

$$f(x) = x$$

where $x = C_{NAi}, C_{NBi}$

The third initial array determining apparatus 30 is furthermore described below in detail.

Assuming that the number of the cells in the divided area $D_A$ connected to the net $NA_i$ is $C_{NAi}$ in the net $NA_i$, ($i=1, 2, \ldots, N_a$) contained in the divided area $D_A$, then the cost $CosT_a$ of the net congestion contained in the area $D_A$ is defined as follows.

$$CosT_a = \sum_{i=1}^{N_a} f(C_{NAi}) \tag{9}$$

In equation (9), f(x) is a function for use in converting the number of cells connected to each net $NA_i$ into the net congestion level.

Assuming that f(x)=x, x indicates the number of terminals connected to one net and therefore refers to the idea of the terminal congestion cost in the second initial array determining apparatus 20. Actually if f(x)=logx, the process meets the execution result of the mini-cut method.

Likewise, the congestion cost $CosT_b$ of the net is defined as follows for the area $D_B$.

$$\text{Cos}T_b = \sum_{i=1}^{N_a} f(C_{NBi}) \tag{10}$$

The above described costs $\text{CosT}_a$ and $\text{CosT}_b$ are defined as the net cell sizes of the divided areas $D_A$ and $D_B$ respectively.

Therefore, the feedthrough area θ assigned to a net is computed as follows.

$$\theta = \frac{\lambda(1-\gamma)(A+B)}{\text{Cos}T_a + \text{Cos}T_b} \tag{11}$$

The restrictive condition is computed as follows.

$$\left| \frac{C_a + \theta \cdot \text{Cos}T_a}{A} - \frac{C_b + \theta \cdot \text{Cos}T_b}{B} \right| \leq \epsilon \tag{6}$$

The third initial array determining apparatus 30 computes the weigh depending on the number of cells connected to one net in calculating the net cell size considered by the above described first initial array determining apparatus 10. Thus, the congestion costs $\text{CosT}_a$ and $\text{CosT}_b$ of the net are obtained. Then, the net cell size is computed such that the net cell size correctly reflects the difficulty level of the line connection. Finally, the mini-cut method is performed under the restrictive condition that the integral cell size obtained by adding the cell size to the net cell size can be well balanced between both divided areas. Since the cells are arrayed in a way that the terminal congestion can be levelled in each of the divided areas, the connection rate can be improved.

Thus, the third initial array determining apparatus 30 computes the weigh depending on the number of cells connected to one net in calculating the net cell size, that is, a factor of the restrictive condition. Therefore, it computes the net cell size more correctly than the first initial array determining apparatus 10, thereby arraying the cells with improved connection rate.

A fourth initial array determining apparatus 40 described below progressively simultaneously performs the mini-cut method and generally connects lines, thereby obtaining the number of nets passing each of the divided areas. The number of passing nets is added to the $N_a$ and $N_b$ obtained by the first initial array determining apparatus 10 to compute a new net cell size. Using the new net cell size, the cell use rate (cell occupation rate) in the divided areas through which a lot of nets are expected to pass can be reduced, thereby improving the connection rate. That is, it is considered that a net connection area is required in the divided areas through which a lot of nets pass.

Figure 10:
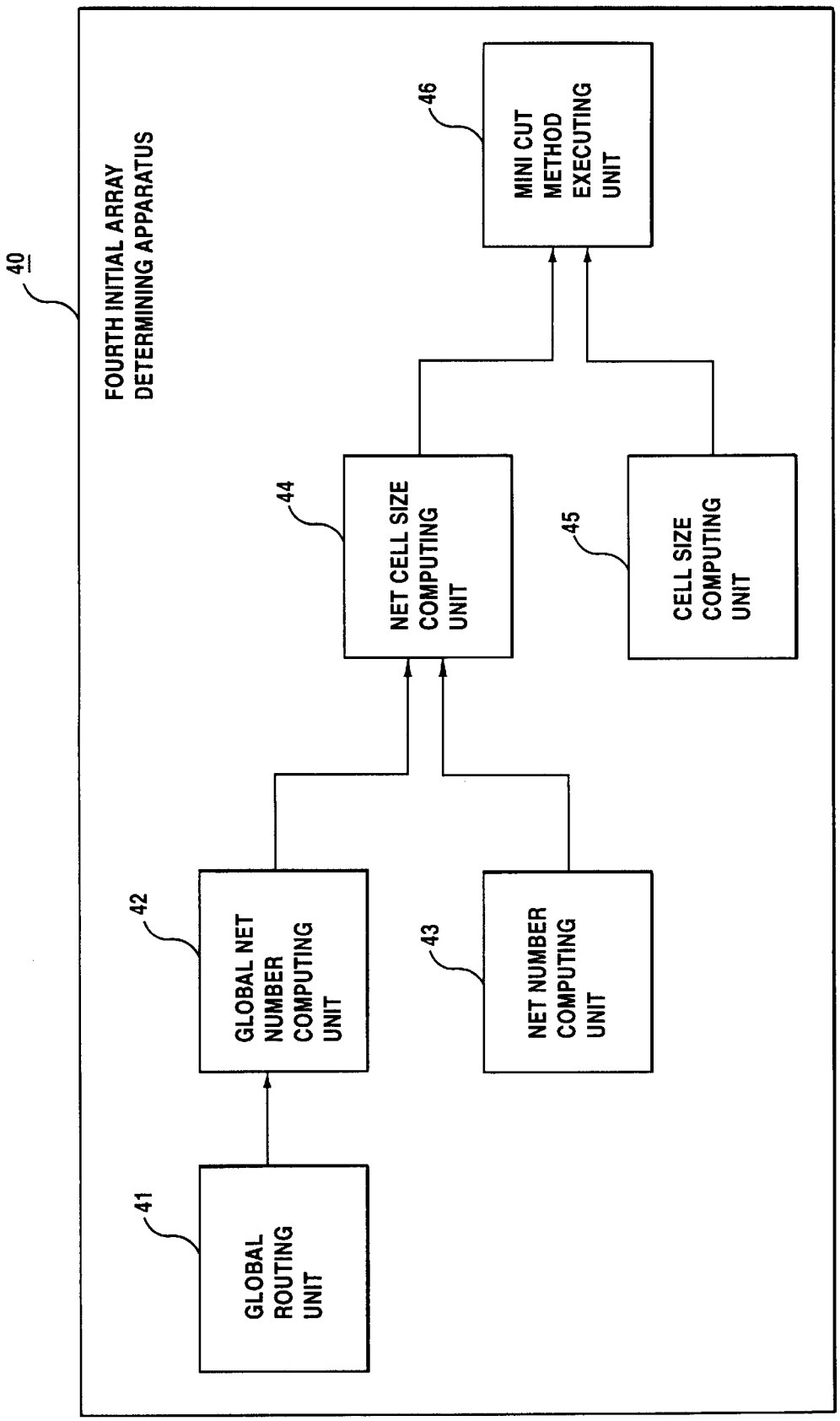
FIG. 10 is a block diagram showing the configuration of the fourth initial array determining apparatus according to the present invention.

FIG. 10 is a block diagram showing the configuration of the fourth initial array determining apparatus 40.

The fourth initial array determining apparatus 40 determines the initial array of cells forming an integrated circuit by setting cut lines in the area of the integrated circuit and repeating a cell shifting operation among the areas divided by the cut lines such that the number of cuts, that is, the number of connection lines cut by the cut lines, can be minimized.

The fourth initial array determining apparatus 40 comprises a global routing unit 41, a global net number computing unit 42, a net number computing unit 43, a net cell size computing unit 44, a cell size computing unit 45, and a mini-cut method executing unit 46.

The global routing unit 41 performs global routing.

The global net number computing unit 42 computes $TN_a$ and $TN_b$, that is, the numbers of the global nets passing through the divided areas $D_A$ and $D_B$ respectively based on the global nets connected by the global routing unit 41.

The net number computing unit 43 computes the sums $N_a$ and $N_b$ of the nets respectively contained in the areas $D_A$ and $D_B$ divided by the cut lines.

The net cell size computing unit 44 computes the net cell sizes of the above described two divided areas $D_A$ and $D_B$ based on the computation results from the net number computing unit 43 and general connection line number computing unit 42.

The cell size computing unit 45 computes the sums $C_a$ and $C_b$ of the sizes of the cells contained in the areas $D_A$ and $D_B$ respectively divided by the cut lines.

The mini-cut method executing unit 46 performs for the divided areas $D_A$ and $D_B$ the mini-cut method under the restrictive condition that the respective total of the cell size sums computed by the cell size computing unit 45 and the net cell size computed by the net cell size computing unit 44 can be well balanced.

The net cell size computing unit 44 obtains the $N_a+TN_a$ and $N_b+TN_b$ as the net cell sizes of the divided areas $D_A$ and $D_B$ respectively.

Figure 11:
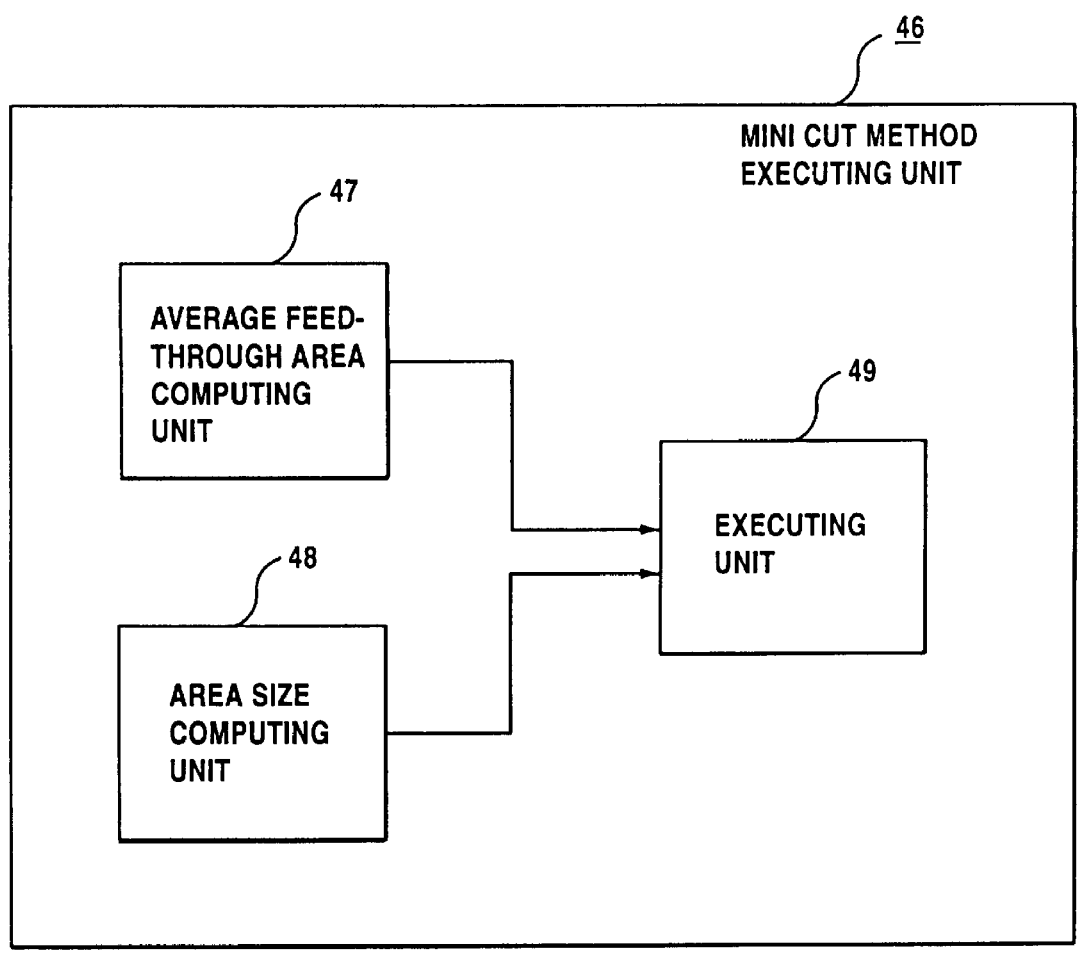
FIG. 11 shows an example of the configuration of the mini-cut method executing unit shown in FIG. 10.

FIG. 11 shows an example of the configuration of the mini-cut method executing unit 46.

The mini-cut method executing unit 46 comprises an average feedthrough area computing unit 47, an area size computing unit 48, and an executing unit 49.

The average feedthrough area computing unit 47 computes the average feedthrough area θ of the areas divided by the cut lines.

The area size computing unit 48 computes the area sizes A and B of the two divided areas $D_A$ and $D_B$.

The executing unit 49 performs the mini-cut method such that the restrictive condition represented by the following equation (12) can be satisfied based on the computation results from the average feedthrough area computing unit 47 and area size computing unit 48.

$$\left| \frac{C_a + \theta \cdot (N_a + TN_a)}{A} - \frac{C_b + \theta \cdot (N_b + TN_b)}{B} \right| \leq \epsilon \tag{12}$$

The average feedthrough area computing unit 47 computes the use rate γ of the area divided by the cut line by the following equation (2), and computes the average feedthrough area θ by the following equation (3).

$$\gamma = \frac{C_a + C_b}{A + B} \tag{2}$$

$$\theta = \frac{\lambda(1-\gamma)(A+B)}{N_{all}} \tag{3}$$

The fourth initial array determining apparatus 40 progressively performs the mini-cut method and simultaneously global routing. Then, it adds the numbers $N_a$ and $TN_b$ of the global nets passing through the divided areas to the net cell sizes $N_a$ and $N_b$ computed by the first initial array determining apparatus 10, and defines the obtained sums $N_a+TN_a$ and $N_b+TN_b$ as new net cell sizes. Then, it performs the mini-cut method under the restrictive condition that the integral cell size obtained by adding the cell sizes $C_a$ and $C_b$ to the net cell sizes $N_a+TN_a$ and $N_b+TN_b$ can be well balanced in both divided areas. Since the cells are arrayed such that the terminal congestion can be levelled in each of the divided areas, the connection rate of the integrated circuit can be improved.

Figure 12:
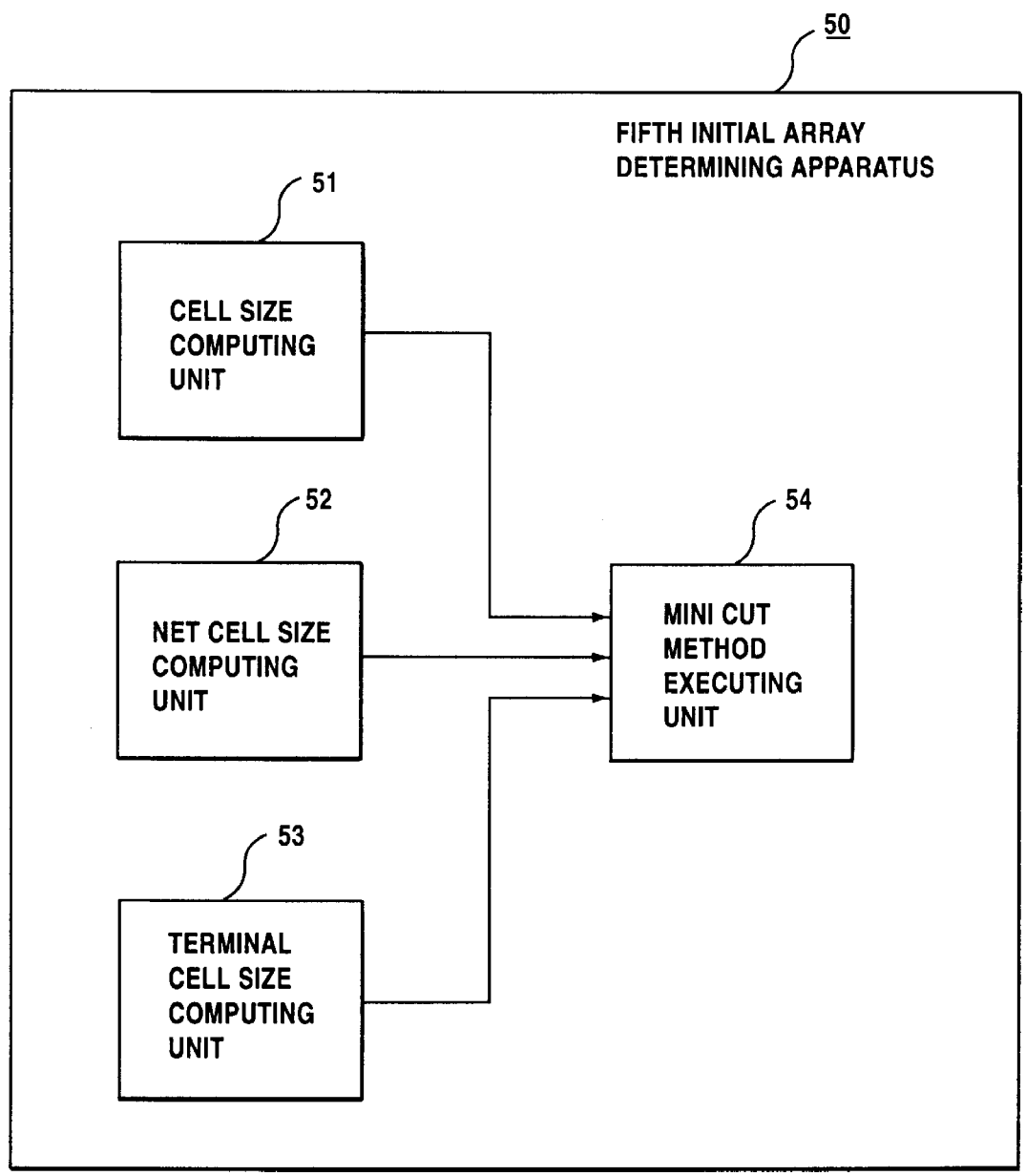
FIG. 12 is a block diagram showing the configuration of the fifth initial array determining apparatus according to the present invention.

FIG. 12 is a block diagram showing the configuration of a fifth initial array determining apparatus 50.

The fifth initial array determining apparatus 50 determines the initial array of cells forming an integrated circuit by setting cut lines in the area of the integrated circuit and repeating a cell shifting operation among the areas divided by cut lines such that the number of cuts, that is, the number of connection lines, cut by the cut lines can be minimized.

The above described fifth initial array determining apparatus 50 comprises a cell size computing unit 51, a net cell size computing unit 52, a terminal cell size computing unit 53, and a mini-cut method executing unit 54.

The cell size computing unit 51 computes the sums $C_a$ and $C_b$ of the sizes of the cells contained in the $D_A$ and $D_B$ divided by the cut line.

The net cell size computing unit 52 obtains the sum of the nets contained in the $D_A$ and $D_B$ divided by the cut lines, and computes them as the net cell sizes $N_a$ and $N_b$.

The terminal cell size computing unit 53 obtains the sum of the terminals of all cells contained in the $D_A$ and $D_B$ divided by the cut lines, and computes them as the terminal cell sizes $P_a$ and $P_b$.

The mini-cut method executing unit 54 performs the mini-cut method under the restrictive conditions that the respective total of the cell sizes sums and the above described net cell sizes, and the sum of the cell size sums and the above described terminal cell sizes are both well balanced for the above described two divided areas $D_A$ and $D_B$ based on the computation results from the cell size computing unit 51, net cell size computing unit 52, and terminal cell size computing unit 53.

The fifth initial array determining apparatus 50 is a combination of the technologies of the first initial array determining apparatus 10 and second initial array determining apparatus 20. That is, the mini-cut method is performed in consideration of the cell sizes $C_a$ and $C_b$, the net cell sizes $N_a$ and $N_b$ obtained by replacing the numbers of the nets with the cell sizes, and the terminal cell sizes $P_a$ and $P_b$ under the restrictive condition that the integrated cell size obtained by adding the cell sizes $C_a$ and $C_b$ to the net cell sizes $N_a$ and $N_b$ and the integrated cell size obtained by adding the cell sizes $C_a$ and $C_b$ to the terminal cell sizes $P_a$ and $P_b$ can be well balanced in both divided areas.

Thus, the fifth initial array determining apparatus 50 performs the mini-cut method such that both restrictive conditions represented by the above listed equations (1) and (5) can be satisfied. Thus, the net congestion and terminal congestion are simultaneously considered while performing the mini-cut method.

Since the cells are arrayed in a way that the net congestion is levelled in each of the divided areas, the connection rate of the integrated circuit can be successfully improved.

Figure 13:
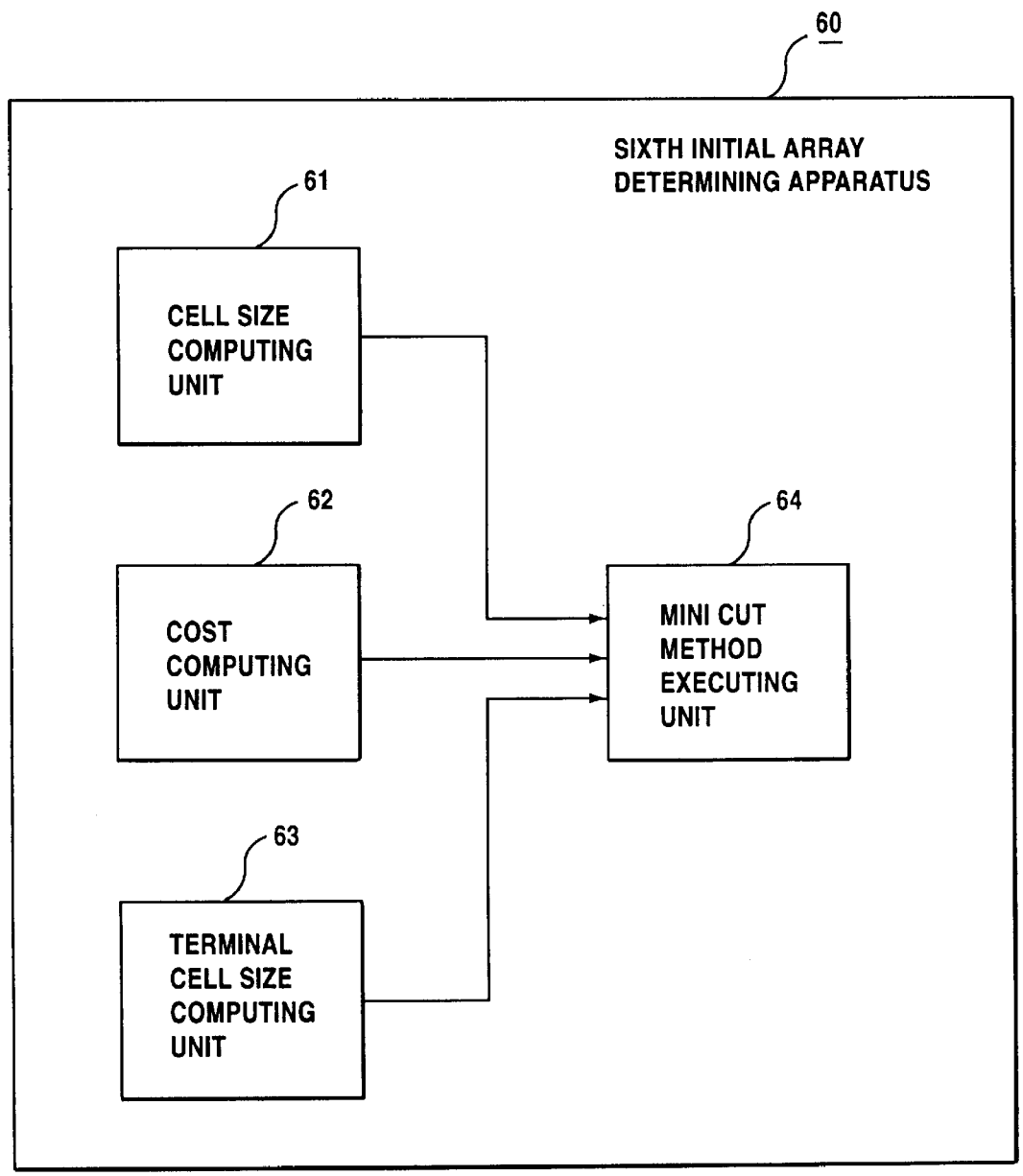
FIG. 13 is a block diagram showing the configuration of the sixth initial array determining apparatus according to the present invention.

FIG. 13 is a block diagram showing the configuration of a sixth initial array determining apparatus 60 according to the present invention.

The sixth initial array determining apparatus 60 determines the initial array of cells forming an integrated circuit by setting cut lines in the area of the integrated circuit and repeating a cell shifting operation among the areas divided by cut lines such that the number of cuts, that is, the number of connection lines, cut by the cut lines can be minimized.

The above described sixth initial array determining apparatus 60 comprises a cell size computing unit 61, a cost computing unit 62, a terminal cell size computing unit 63, and a mini-cut method executing unit 64.

The cell size computing unit 61 computes the sums $C_a$ and $C_b$ of the sizes of the cells contained in the $D_A$ and $D_B$ divided by the cut line.

The cost computing unit 62 computes the costs $CosT_a$ and $CosT_b$ of the congestion of the nets contained respectively in the areas $D_A$ and $D_B$ divided by the cut lines.

The terminal cell size computing unit 63 obtains the sum of the terminals of all cells contained in the $D_A$ and $D_B$ divided by the cut lines, and computes them as the terminal cell sizes $P_a$ and $P_b$.

The mini-cut method executing unit 64 performs the mini-cut method under the restrictive conditions that the respective total of the cell size sums and the net congestion costs, and the respective total of the cell size sums and the above described terminal cell sizes are both well balanced for the above described two divided areas $D_A$ and $D_B$ based on the computation results from the cell size computing unit 61, cost computing unit 62, and terminal cell size computing unit 63.

The sixth initial array determining apparatus 60 is a combination of the technologies of the second initial array determining apparatus 20 and third initial array determining apparatus 30. That is, the mini-cut method is performed in consideration of the cell sizes $C_a$ and $C_b$, the costs $CosT_a$ and $CosT_b$, and the terminal cell sizes $P_a$ and $P_b$ under the restrictive condition that the integrated cell size obtained by adding the cell sizes $C_a$ and $C_b$ to the costs $CosT_a$ and $CosT_b$ and the integrated cell size obtained by adding the cell sizes $C_a$ and $C_b$ to the terminal cell sizes $P_a$ and $P_b$ can be well balanced in both divided areas.

Thus, the sixth initial array determining apparatus 60 performs the mini-cut method such that both restrictive conditions represented by the above listed equations (5) and (6) can be satisfied.

Thus, as in the fifth initial array determining apparatus 50, the net congestion and terminal congestion are simultaneously considered while performing the mini-cut method, and therefore the connection rate can be furthermore improved. Particularly, this technology is effective to the cell array of the integrated circuit in which the number of cells connected to one net is unstable.

Since the cells are arrayed in a way that the net congestion is levelled in each of the divided areas, the connection rate of the integrated circuit can be successfully improved.

Figure 14:
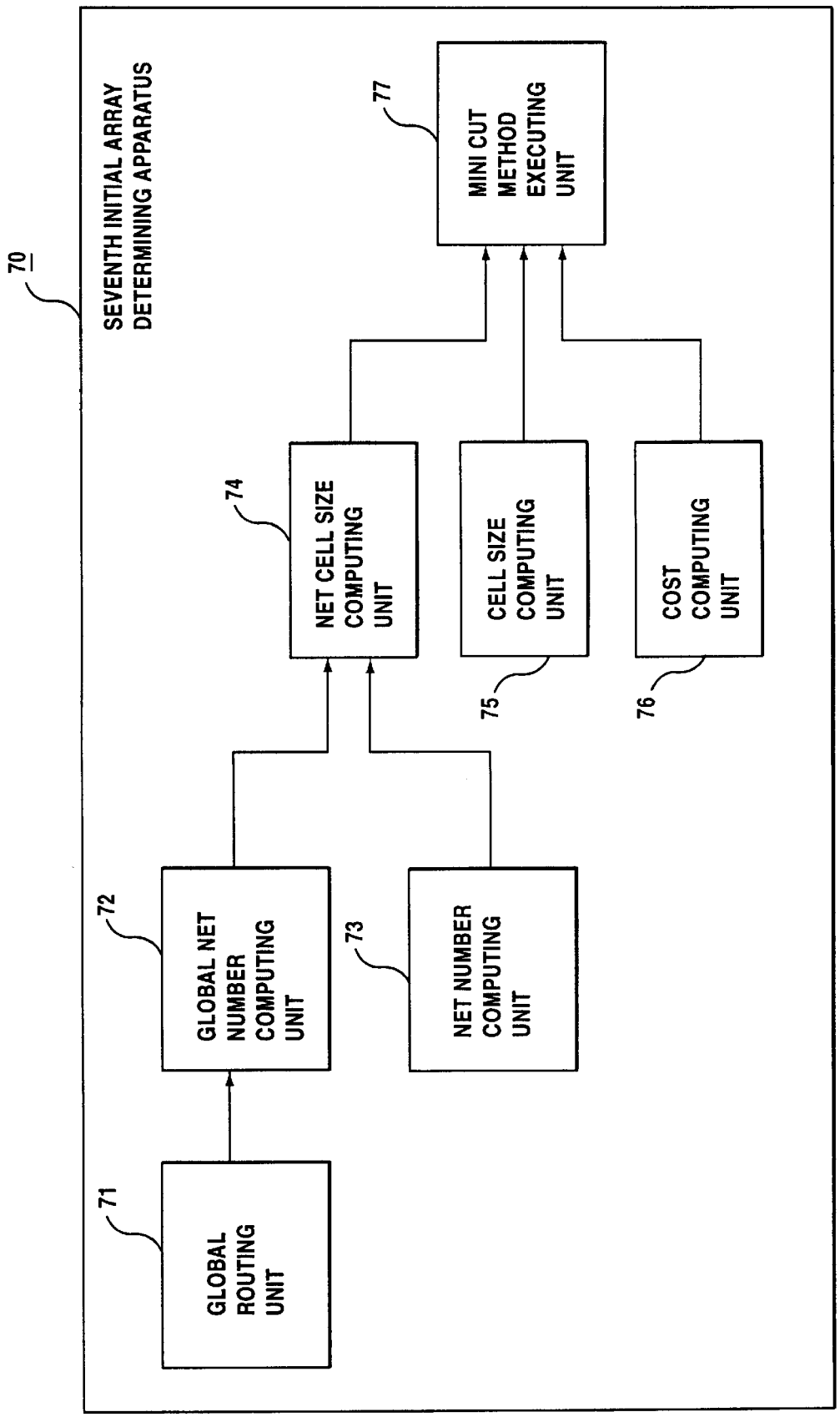
FIG. 14 is a block diagram showing the configuration of the seventh initial array determining apparatus according to the present invention.

FIG. 14 is a block diagram showing the configuration of a seventh initial array determining apparatus 70.

The seventh initial array determining apparatus 70 determines the initial array of cells forming an integrated circuit by setting cut lines in the area of the integrated circuit and repeating a cell shifting operation among the areas divided by the cut lines such that the number of cuts, that is, the number of connection lines cut by the cut lines, can be minimized.

The seventh initial array determining apparatus 70 comprises a global routing unit 71, a global net number computing unit 72, a net number computing unit 73, a net cell size computing unit 74, a cell size computing unit 75, a cost computing unit 76, and a mini-cut method executing unit 77.

The global routing unit 71 performs global routing.

The global net number computing unit 72 computes $TN_a$ and $TN_b$, that is, the numbers of the global nets passing through the divided areas $D_A$ and $D_B$ respectively based on the result of the global nets connected by the global routing unit 71.

The net number computing unit 73 computes the sums $N_a$ and $N_b$ of the nets respectively contained in the areas $D_A$ and $D_B$ divided by the cut lines.

The net cell size computing unit 74 computes the net cell sizes of the above described two divided areas $D_A$ and $D_B$ based on the computation results from the net number computing unit 73 and global net number computing unit 72.

The cell size computing unit 75 computes the sums $C_a$ and $C_b$ of the sizes of the cells contained respectively in the areas $D_A$ and $D_B$ divided by the cut lines.

The cost computing unit 76 computes the costs $CosT_a$ and $CosT_b$ of the congestion of the nets contained respectively in the areas $D_A$ and $D_B$ divided by the cut lines.

The mini-cut method executing unit 77 performs the mini-cut method under the restrictive conditions that the respective total of the cell size sums and the net congestion costs, and the respective total of the cell size sums and the above described net cell sizes are both well balanced for the above described two divided areas $D_A$ and $D_B$ based on the computation results from the cell size computing unit 75, cost computing unit 76, and net cell size computing unit 74.

The seventh initial array determining apparatus 70 is a combination of the technologies of the third initial array determining apparatus 30 and fourth initial array determining apparatus 40. That is, the mini-cut method is performed in consideration of the cell sizes $C_a$ and $C_b$, the costs $CosT_a$ and $CosT_b$, and the net cell sizes $TN_a$ and $TN_b$, under the restrictive condition that the integrated cell size obtained by adding the cell sizes $C_a$ and $C_b$ to the costs $CosT_a$ and $CosT_b$ and the integrated cell size obtained by adding the cell sizes $C_a$ and $C_b$ to the net cell sizes $TN_a$ and $TN_b$ can be well balanced in both divided areas.

Thus, the seventh initial array determining apparatus 70 performs the mini-cut method such that both restrictive conditions represented by the above listed equations (6) and (12) can be satisfied. Thus, the net congestion and passing net congestion are simultaneously considered while performing the mini-cut method, and therefore the connection rate can be furthermore improved.

Since the cells are arrayed in a way that the net congestion is levelled in each of the divided areas, the connection rate of the integrated circuit can be successfully improved.

Figure 15:
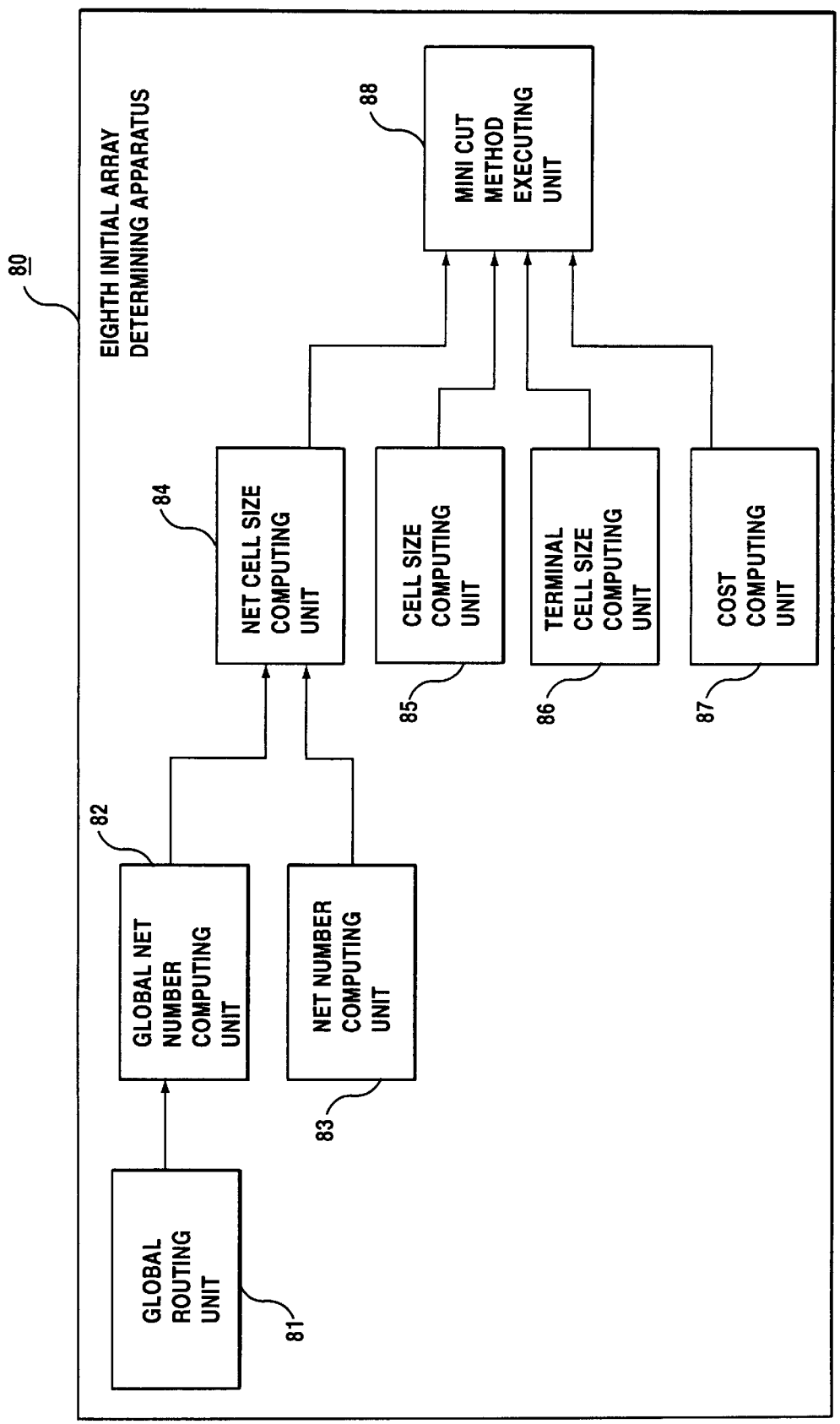
FIG. 15 is a block diagram showing the configuration of the eighth initial array determining apparatus according to the present invention.

FIG. 15 is a block diagram showing the configuration of an eighth initial array determining apparatus 80.

The eighth initial array determining apparatus 80 determines the initial array of cells forming an integrated circuit by setting cut lines in the area of the integrated circuit and repeating a cell shifting operation among the areas divided by the cut lines such that the number of cuts, that is, the number of connection lines cut by the cut lines, can be minimized.

The eighth initial array determining apparatus 80 comprises a global routing unit 81, a global net number computing unit 82, a net number computing unit 83, a net cell size computing unit 84, a cell size computing unit 85, a terminal cell size computing unit 86, a cost computing unit 87, and a mini-cut method executing unit 88.

The global routing unit 81 performs global routing.

The global net number computing unit 82 computes $TN_a$ and $TN_b$, that is, the numbers of the global nets passing through the divided areas $D_A$ and $D_B$ respectively based on the global nets connected by the global routing unit 81.

The net number computing unit 83 computes the sums $N_a$ and $N_b$ of the nets respectively contained in the areas $D_A$ and $D_B$ divided by the cut lines.

The net cell size computing unit 84 computes the net cell sizes of the above described two divided areas $D_A$ and $D_B$ based on the computation results from the net number computing unit 83 and global net number computing unit 82.

The cell size computing unit 85 computes the sums $C_a$ and $C_b$ of the sizes of the cells contained respectively in the areas $D_A$ and $D_B$ divided by the cut lines.

The terminal cell size computing unit 86 obtains the sum of the terminals of all cells contained in the $D_A$ and $D_B$ divided by the cut lines, and computes them as the terminal cell sizes $P_a$ and $P_b$.

The cost computing unit 87 computes the costs $CosT_a$ and $CosT_b$ of the congestion of the nets contained respectively in the areas $D_A$ and $D_B$ divided by the cut lines.

The mini-cut method executing unit 88 performs the mini-cut method under the following three restrictive conditions.

(a) The restrictive condition that the respective total of the cell size sums and the terminal cell sizes is well balanced for the above described two divided areas $D_A$ and $D_B$ based on the computation results from the cell size computing unit 85 and terminal cell size computing unit 86.

(b) The restrictive condition that the respective total of the cell size sums and the net congestion costs is well balanced for the above described two divided areas $D_A$ and $D_B$ based on the computation results from the cell size computing unit 85 and cost computing unit 87.

(c) The restrictive condition that the respective total of the cell size sums and the net cell sizes is well balanced for the above described two divided areas $D_A$ and $D_B$ based on the computation results from the cell size computing unit 85 and net cell size computing unit 84.

That is, the eighth initial array determining apparatus 80 performs the mini-cut method in a way that the three restrictive conditions represented by the above listed equations (5), (6), and (12) are satisfied.

The eighth initial array determining apparatus 80 is a combination of the technologies of the third initial array determining apparatus 30, fourth initial array determining apparatus 40, and the fifth initial array determining apparatus 50.

That is, the mini-cut method is performed in consideration of the cell sizes $C_a$ and $C_b$, the terminal cell sizes $P_a$ and $P_b$, the costs $CosT_a$ and $CosT_b$, and the net cell sizes $TN_a$ and $TN_b$ under the restrictive condition that the integrated cell size obtained by adding the cell sizes $C_a$ and $C_b$ to the costs $CosT_a$ and $CosT_b$, the integrated cell size obtained by adding the cell sizes $N_a$ and $N_b$ to the terminal cell sizes $TN_a$ and $TN_b$, and the integrated cell size obtained by adding the cell sizes $C_a$ and $C_b$ to the net cell sizes $TN_a$ and $TN_b$ can be well balanced in both divided areas.

Thus, the eighth initial array determining apparatus 80 performs the mini-cut method such that both restrictive conditions represented by the above listed equations (5), (6), and (12) can be satisfied. Thus, the net congestion, terminal density, and passing net congestion are simultaneously considered while performing the mini-cut method, and therefore the connection rate can be furthermore improved.

Since the cells are arrayed in a way that the net congestion is levelled in each of the divided areas, the connection rate of the integrated circuit can be successfully improved.

As described above, the first through eighth initial array determining apparatuses can improve the connection rate by dispersing the net congestion and terminal density using the mini-cut method.

The integrated circuit initial array determining apparatus according to the present invention is described below by referring to more practical examples.

Figure 16:
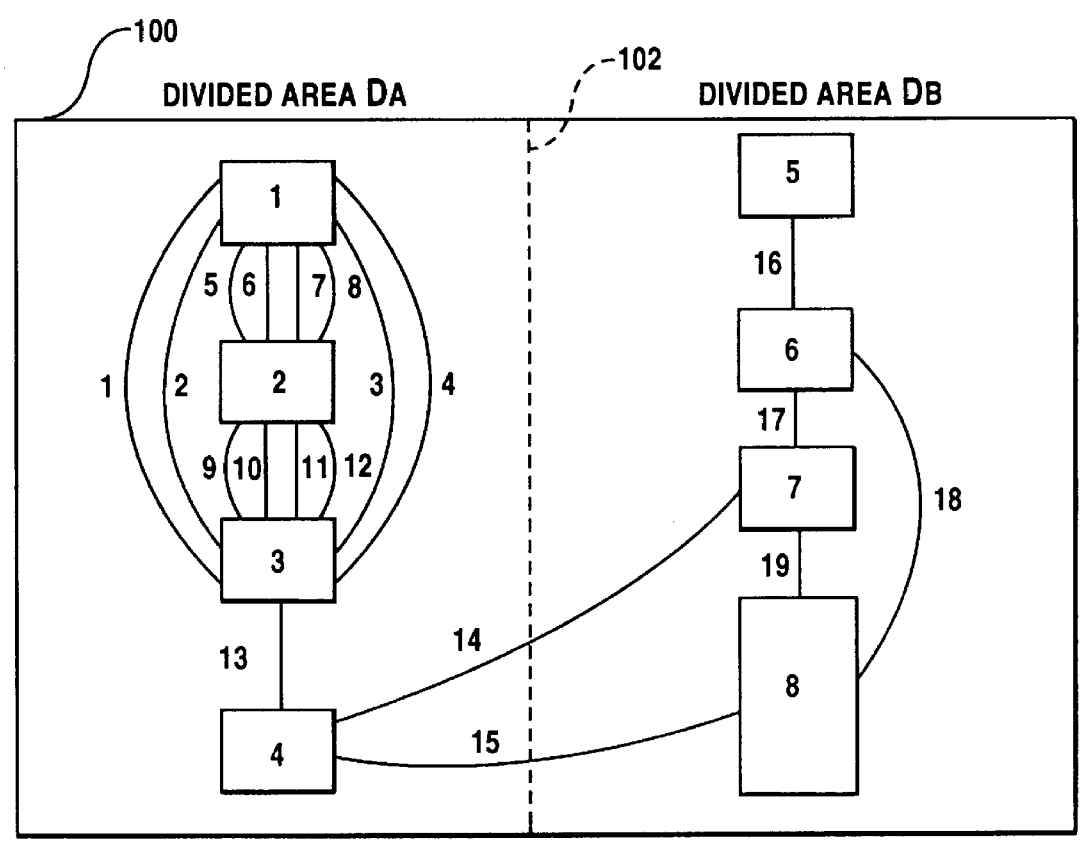
FIG. 16 shows the configuration of the circuit in the area in which the integrated circuit is located and the initial array is performed by the mini-cut method according to the present invention.

FIG. 16 shows the configuration of the circuit in an area 100 in which the integrated circuit is located. The area 100 is divided into two divided areas $D_A$ and $D_B$ by a cut line 102 indicated by broken lines.

The following explanation refers to FIG. 16.

The first initial array determining apparatus 10 is explained in detail by referring to FIGS. 16 through 22.

In FIG. 16, four cells (cells 1, 2, 3, and 4) assigned serial cell numbers 1 through 4 are arrayed in the divided area $D_A$. The terminals of these four cells are connected through 13 nets (nets 1 through 13). Four cells (cells 5, 6, 7, and 8) assigned serial cell numbers 5 through 8 are arrayed in the divided area $D_B$. The terminals of these four cells are connected through four nets (nets 16 through 19).

Figure 17A:
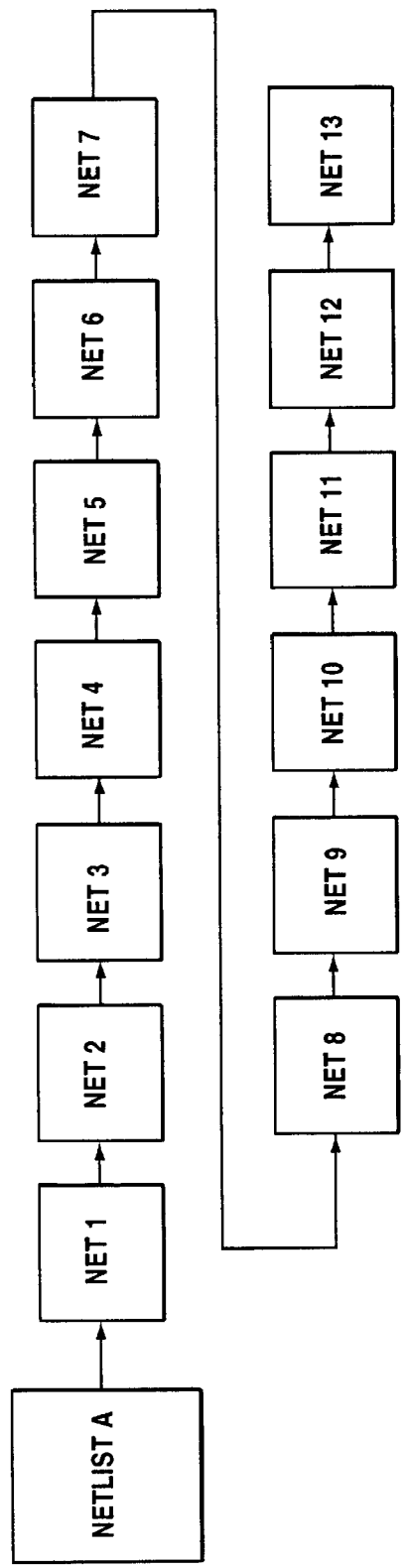
FIGS. 17A and 17B show the structure of the data on the list of the nets contained in the divided areas $D_A$ and $D_B$ shown in FIG. 16.
Figure 17B:
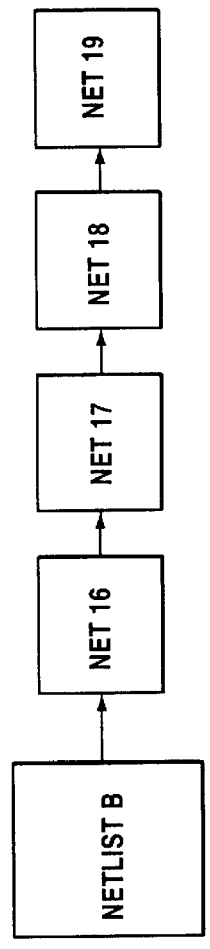

FIGS. 17A and 17B show the data structure of the net lists "netlistA" and "netlistB" for use in retrieving the net contained in each of the divided areas $D_A$ and $D_B$.

In the "netlistA" for the divided area $D_A$ shown in FIG. 17A, the nets assigned the serial numbers 1 through 13 are sequentially linked in the order of net 1, net 2, . . . , and net 13.

In the "netlistB" for the divided area $D_B$ shown in FIG. 17B, the nets assigned the serial numbers 16 through 18 are sequentially linked in the order of net 16, net 17, . . . , and net 18.

Figure 18:
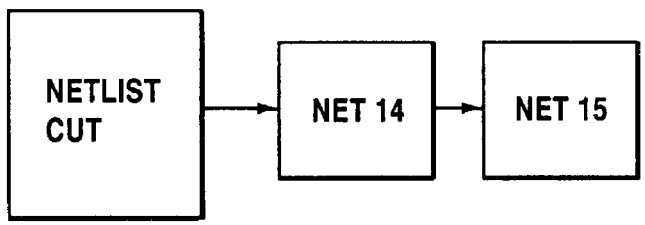
FIG. 18 shows the structure of the data on the list of the nets cut by the cut lines in the circuit shown in FIG. 16.

FIG. 18 shows the net list "netlistCut" for use in retrieving a net cut by the cut line 102. In FIG. 16, the two nets, that is, net 14 and net 15, are cut by the cut line 102, and the two nets 14 and 15 are sequentially linked in the "netlistCut".

Figure 19A:
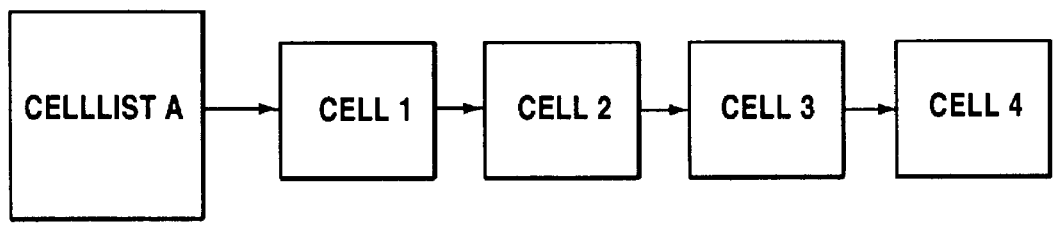
FIGS. 19A and 19B show the structure of the data on the list of the cells contained in the divided areas $D_A$ and $D_B$ shown in FIG. 16.
Figure 19B:
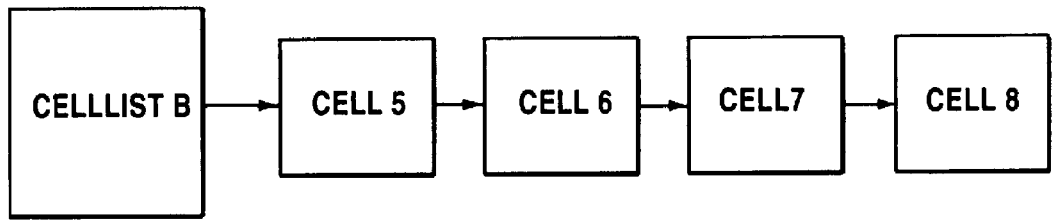

FIGS. 19A and 19B show the data structure for the cell lists "celllistA" and "celllistB" for use in retrieving a cell contained in each of the divided areas $D_A$ and $D_B$.

The "celllistA" shown in FIG. 19A is a list in which four cells 11 through 14 in the divided area $D_A$ are linked in the divided areas.

The "celllistB" shown in FIG. 19B is a list in which four cells 5 through 8 in the divided area $D_B$ are linked in the divided areas.

Figure 20:
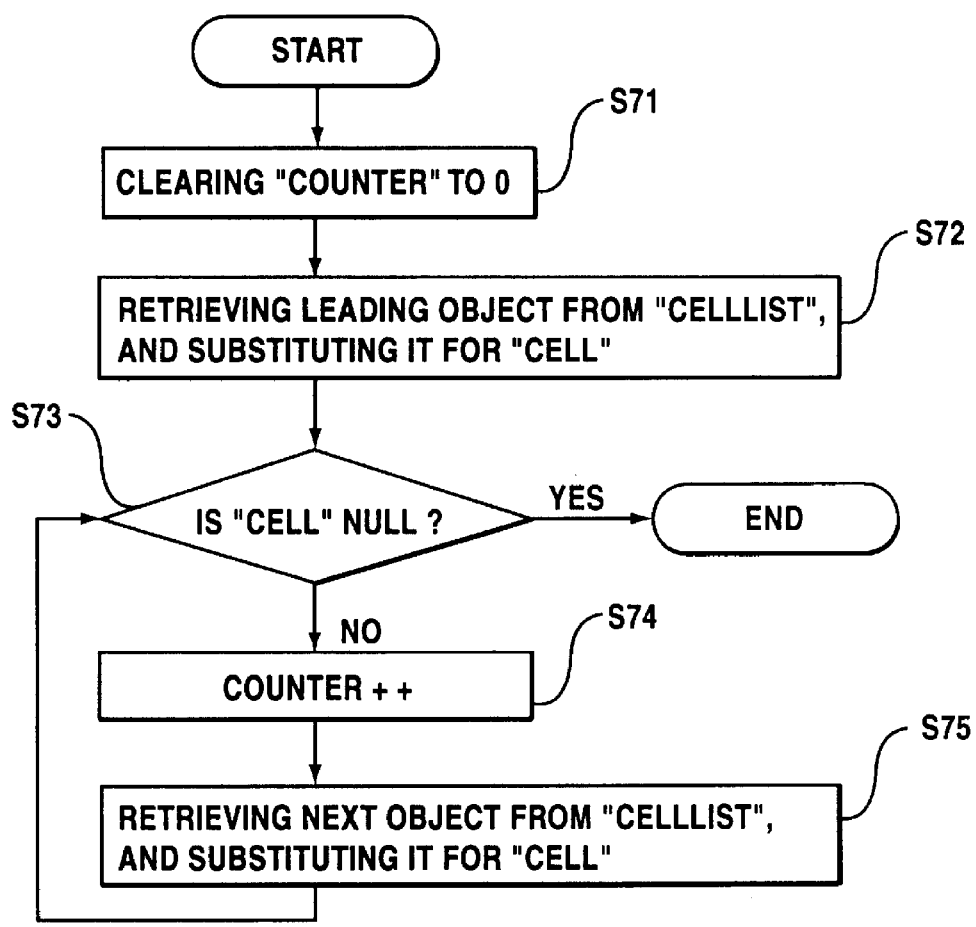
FIG. 20 is an operating flowchart showing the process of computing the number of cells contained in the divided areas $D_A$ and $D_B$ shown in FIG. 16.

FIG. 20 is an operating flowchart showing the process of obtaining the numbers of cells $C_a$ and $C_b$ in the divided areas $D_A$ and $D_B$ respectively based on the cell lists (celllistA and celllistB).

In FIG. 20, "counter" is a variable for use in counting the number of cells $C_a$ and $C_b$, and "cell" is a variable for which an object linked in the cell list (celllistA and celllistB) is substituted.

First, the "counter" is cleared to zero (S71). Then, the leading object is retrieved from the "celllistA" or "celllistB" and is substituted in the "cell" (S72).

Then, it is determined whether or not the "cell" is NULL, that is, whether or not all objects have been retrieved from the "celllistA" or "celllistB" (S73). Unless the "cell" is NULL (no in S73), the counter is incremented by 1 (S74). Then, the next object is retrieved from the "celllistA" or "celllistB" and is substituted in the "cell" (S75), and control is returned to step S73.

Thus, the processes in steps 74 and 75 are repeated until it is determined in step S73 that the "cell" is NULL (yes in S73). As a result, the process in FIG. 20 is performed on the cell lists "celllistA" and "celllistB" and the counter is set to the numbers of the cells $C_a$ and $C_b$ contained in the divided areas $D_A$ and $D_B$. That is, the value 4 is obtained as the numbers of cells $C_a$ and $C_b$.

Figure 21:
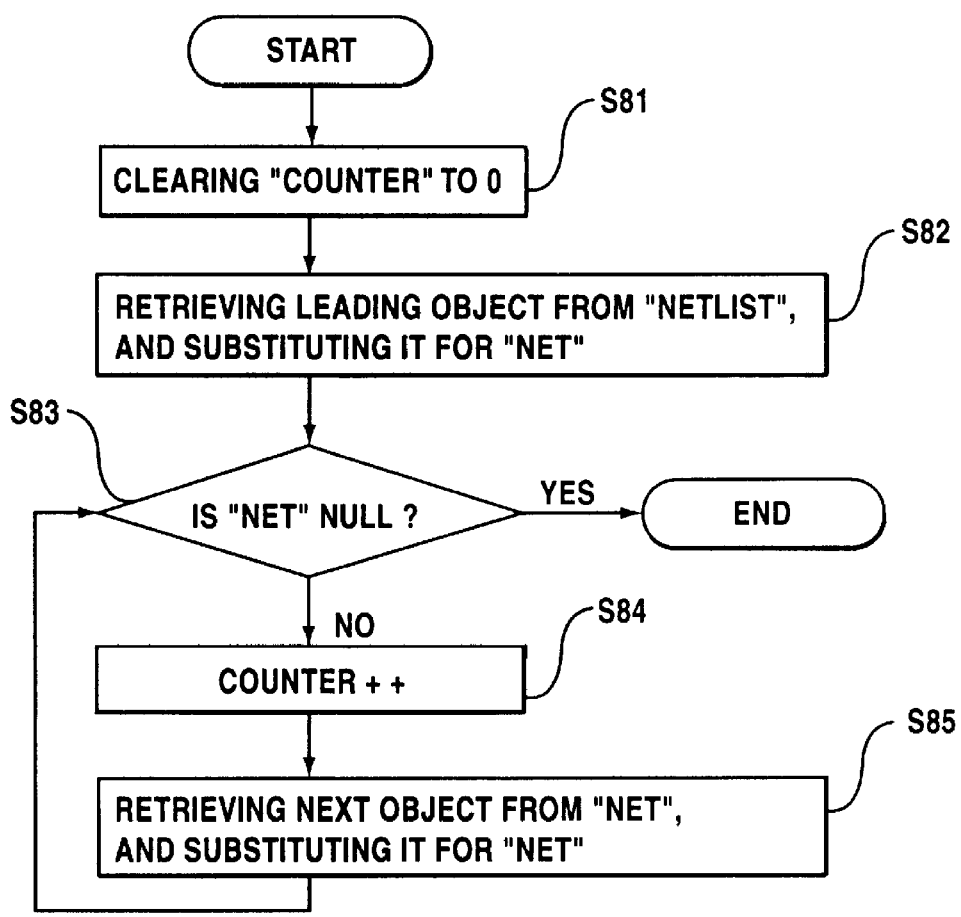
FIG. 21 is an operating flowchart showing the process of computing the number of nets contained in the divided areas $D_A$ and $D_B$ shown in FIG. 16.

Next, FIG. 21 is an operating flowchart showing the process of obtaining the number of nets contained in the divided areas $D_A$ and $D_B$.

In FIG. 21, the "counter" is a variable for use in counting the number of nets $N_a$ and $N_b$, and the "net" is a variable for which an object linked in the net list ("netlistA" and "netlistB") is substituted.

In FIG. 21, the "counter" is cleared to zero (S81). Then, the leading object is retrieved from the net list "netlistJ" (J=A, B, or Cut) and substituted in the "net" (S82).

Then, it is determined whether or not the "net" is NULL, that is, whether or not all objects have been retrieved from the "netlistJ" (S83). Unless the "net" is NULL (no in S83), the counter is incremented by 1 (S84). Then, the next object is retrieved from the "netlistJ" and substituted in the "net" (S85), and control is returned to step S83.

As described above, the processes in steps S84 and S85 are repeated until it is determined in step S83 that the "net" is NULL (yes in S83). As a result, the process in FIG. 21 is performed on the net lists "netlistA" and "netlistB", and "netlistCut", and the counter stores the numbers of the nets $N_a$ and $N_b$ contained in the divided areas $D_A$ and $D_B$ and the number of nets (number of cuts) $N_{cut}$ cut by the cut line 102. That is, the values 13 and 4 are obtained as the numbers of nets $N_a$ and $N_b$ respectively, and 2 is obtained as the number of cuts $N_{cut}$.

Using the obtained numbers of cells $C_a$ and $C_b$, the numbers of nets $N_a$ and $N_b$, and the number of cuts $N_{cut}$, the mini-cut method executing unit 13 of the first initial array determining apparatus 10 performs the mini-cut method on the area 100 shown in FIG. 16.

Before explaining the above described mini-cut method, the conventional mini-cut method is described as follows.

In this case, if equation (4) is applied as the restrictive condition in performing the mini-cut method, the array shown in FIG. 16 is one of the optimum solutions. That is, assuming that A=B=10, $\theta$=0.8, and $\in$=0.1, the restrictive condition of equation (4) is represented as follows.

$$\frac{C_a}{A} = \frac{4}{10} = 0.4 < \frac{C_b}{B} = \frac{6}{10} = 0.6 \tag{13}$$

where the cell (cell4) cannot be move from the divided area $D_A$ to the divided area $D_B$.

However, FIG. 16 shows that the network structure of the divided area $D_A$ is complicated than that of the divided area $D_B$, and that it is harder to connect the divided area $D_A$ than the divided area $D_B$. That is, the cell array shown in FIG. 16 is not optimal.

Using the equation (1) representing the restrictive condition in the first initial array determining apparatus 10, the mini-cut method is performed and represented as follows.

$$\frac{C_a + \theta \cdot N_a}{A} = \frac{4 + 0.8 \times 15}{10} = \tag{14}$$

$$1.6 > \frac{C_b + \theta \cdot N_b}{B} = \frac{6 + 0.8 \times 6}{10} = 1.08$$

Figure 22:
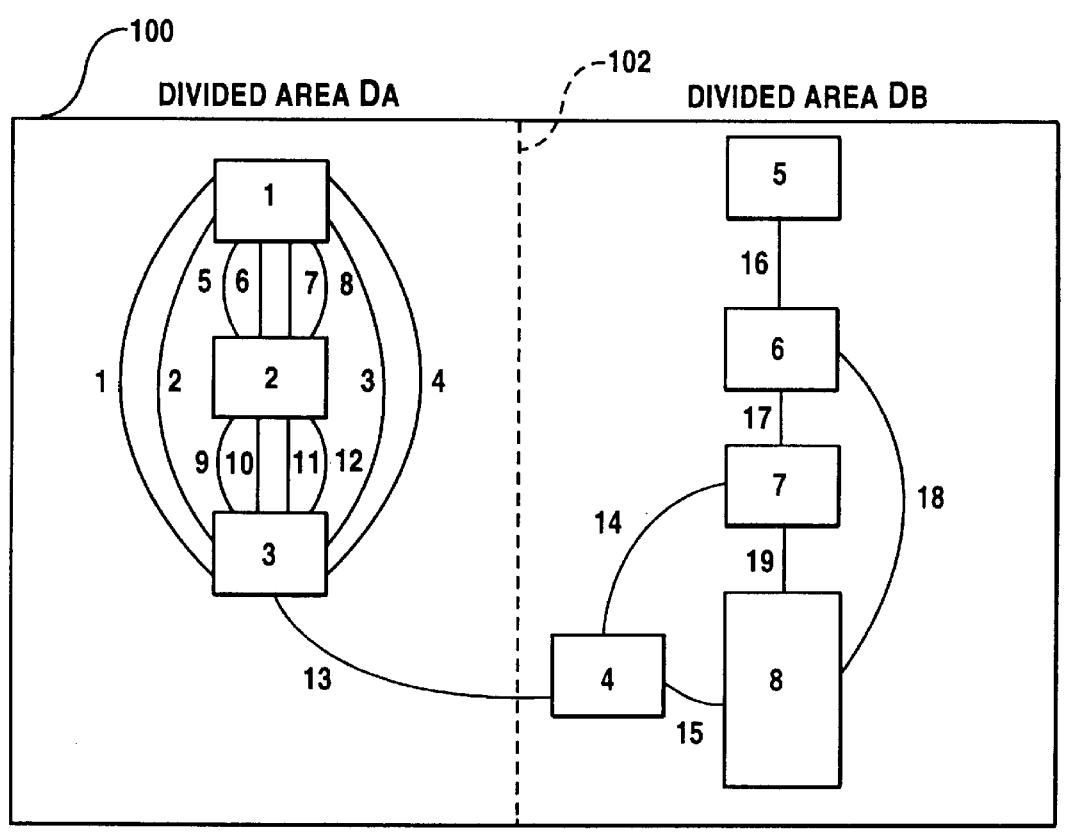
FIG. 22 shows the cell array result obtained by performing on the circuit shown in FIG. 16 the mini-cut method by the first initial array determining apparatus according to the present invention.

Thus, the cell 4 can be moved from the divided area $D_A$ to the divided area $D_B$ as shown in FIG. 22, thereby controlling the cell use rate of the divided area $D_A$. At this time, the number of cuts can be reduced from 2 to 1. As a result, the connection rate at the divided area $D_A$ can be raised.

Figure 3:
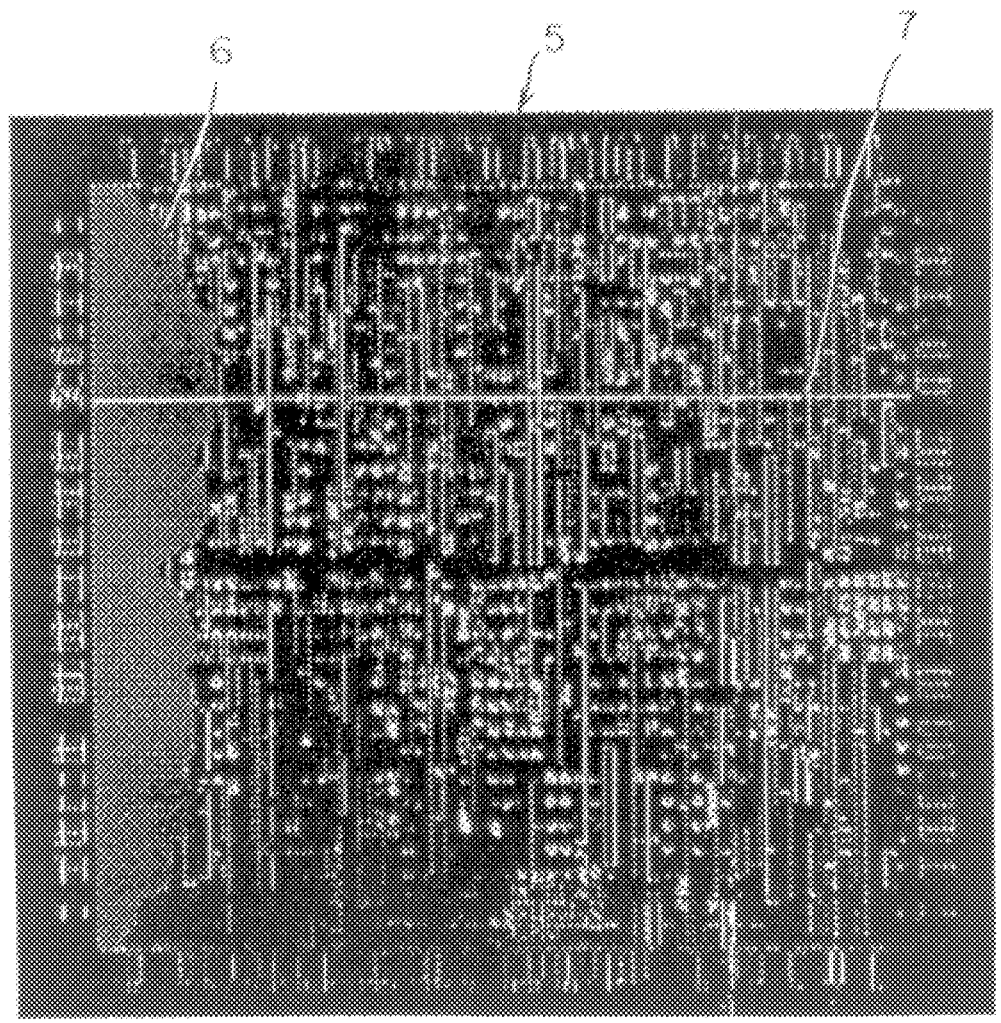
FIG. 3 shows the congestion of the net obtained by performing the conventional mini-cut method on the initial array of the cells of an integrated circuit.
Figure 23:
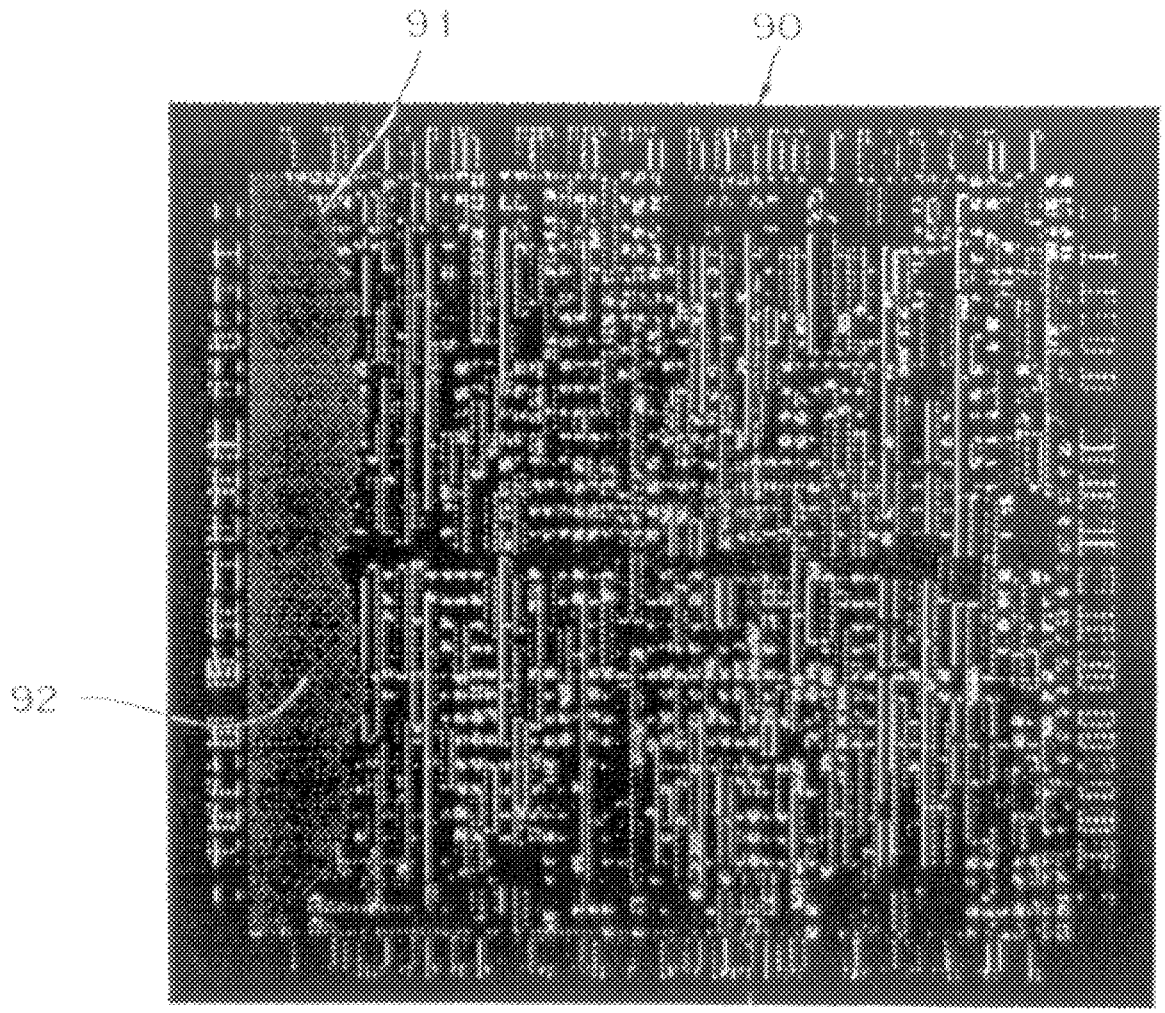
FIG. 23 shows the congestion of the net obtained when the mini-cut method is performed on the initial array of the cells in the integrated circuit shown in FIG. 3 according to the present invention.

FIG. 23 shows the cell array result obtained by performing the mini-cut method of the present invention on the integrated circuit 3 shown in FIG. 3, and the net congestion in each portion of the integrated circuit obtained by generating the minimum spanning tree for the entire net.

In FIG. 23, a curve 91 on the left side of an integrated circuit 90 (equivalent to the integrated circuit 3) indicates the congestion of the net. The curve 91 indicates that the area just below the center portion (marked with a horizontal line 92) of the integrated circuit 90 is the peak of the net congestion. The peak value is smaller than that shown in FIG. 3.

As shown in FIG. 23, the curve 91 is a curve smoother than the curve 6 shown in FIG. 3. This implies that the net congestion is well balanced in the entire integrated circuit 90.

Described below is the mini-cut method performed by the second initial array determining apparatus 20.

FIG. 24 shows the configuration of the cell table 110 storing the unique information (cell size, number of terminals, position) associated with each of the cells 1 through 8 respectively assigned the cell numbers 1 through 8 contained in each of the divided areas $D_A$ and $D_B$ shown in FIG. 16.

In FIG. 24, the cell size indicates the area of a cell, and the number of terminals indicates the number of terminals of the cells. The position indicates the divided area to which the cell belongs.

Figure 25:
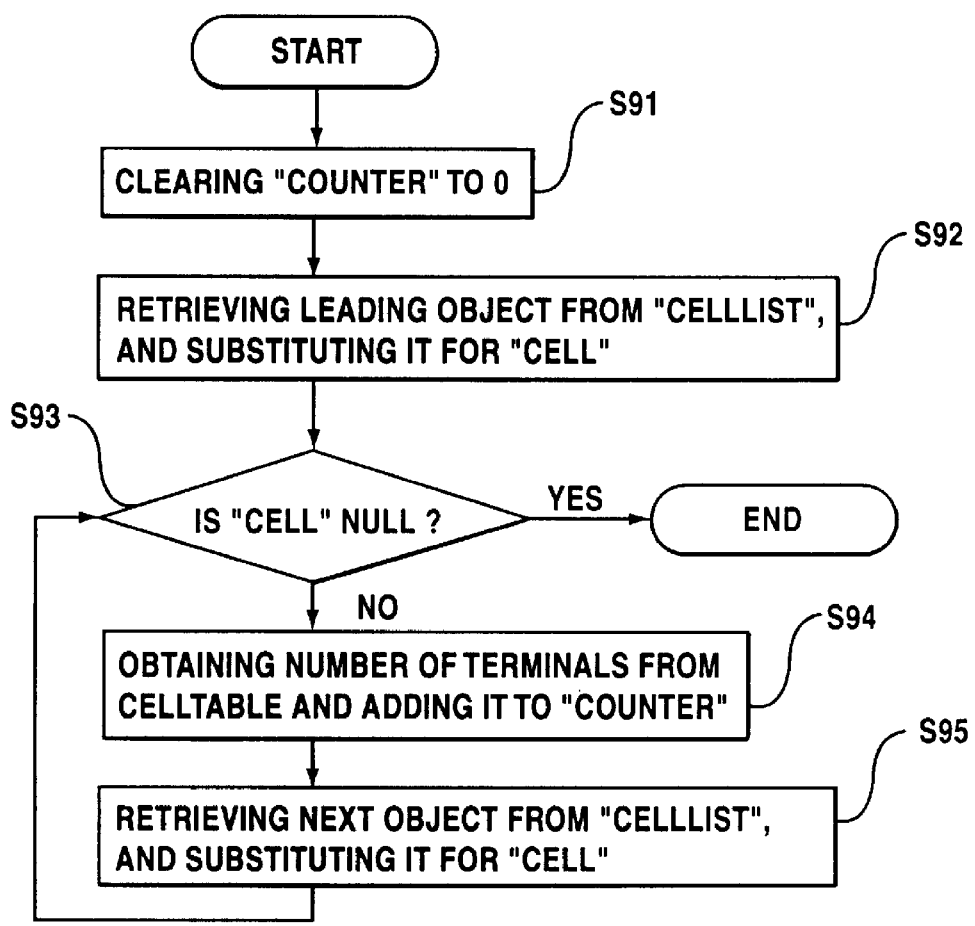
FIG. 25 is an operating flowchart showing the process of obtaining using the table shown in FIG. 24 the number of terminals contained in the divided areas $D_A$ and $D_B$ of the circuit shown in FIG. 16.

FIG. 25 is an operating flowchart showing the process of obtaining the number of terminals in each of the divided areas $D_A$ and $D_B$ shown in FIG. 16 using the table 110 shown in FIG. 24.

In FIG. 25, "counter" is a variable for use in counting the number of terminals $P_a$ and $P_b$, and "cell" is a variable for which an object linked in the cell list (celllistA and celllistB) is substituted.

First, as shown in FIG. 25, the counter is cleared to zero (S91). Then, the leading object is retrieved from the "celllistA" or "celllistB" and substituted in the "cell" (S92).

Then, it is determined whether or not the "cell" is NULL, that is, whether or not all objects have been retrieved from the "celllistA" or "celllistB" (S93). Unless the "cell" is NULL (no in S93), the number of terminals of the cells indicated by the variable "cell" is obtained by referring to the cell table 110, and it is added to the "counter" (S94). Then, the next object is retrieved from the "celllistA" or "celllistB" and substituted in the "cell" (S95), and control is returned to step S93.

Thus, the processes in steps 94 and 95 are repeated until it is determined in step S93 that the "cell" is NULL (yes in S93).

The processes in FIG. 25 are performed on the cell lists "celllistA" and "celllistB" and the counter is set to the numbers of the terminals $P_a$ and $P_b$ contained in the divided areas $D_A$ and $D_B$. That is, the value 28 is obtained as the number of terminals $P_a$ and the value 14 is obtained as the number of terminals $P_b$.

Thus, the mini-cut method is performed while substituting the obtained numbers of the terminals $P_a$ and $P_b$ in equation (5) representing the restrictive condition.

Described below is the practical operations of the third initial array determining apparatus 30.

FIG. 26 shows the configuration of the data on a net table 120 storing the information about each of the nets 1 through 19 in the area 100 shown in FIG. 16.

In FIG. 26, the cell countA stores the number of cells belonging to the divided area $D_A$ connected to each net while the cell countB stores the number of cells belonging to the divided area $D_B$ connected to each net.

Figure 27:
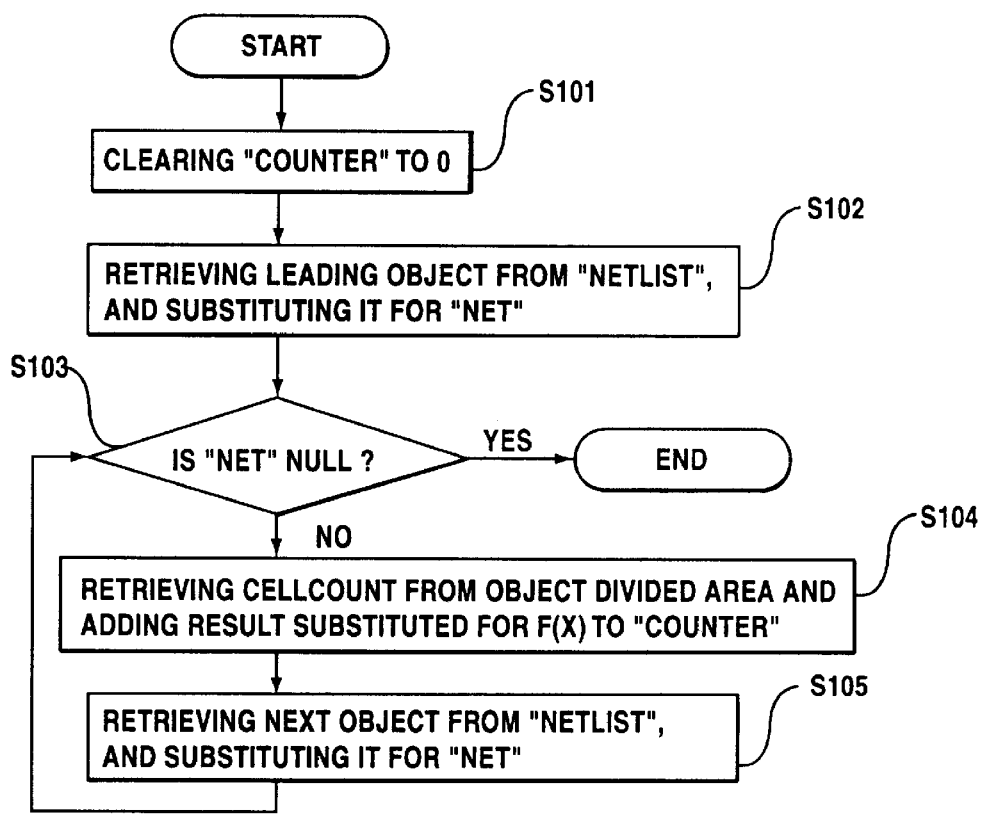
FIG. 27 is an operating flowchart showing the process of obtaining using the table shown in FIG. 26 the cost of the congestion of the nets contained in the divided areas $D_A$ and $D_B$ of the circuit shown in FIG. 16.

FIG. 27 is an operating flowchart showing the process of obtaining the costs $CosT_a$ and $CosT_b$ by the above described equations (9) and (10) using this net table 120.

In FIG. 27, "counter" is a variable for use in counting $\Sigma C_{NAi}$ and $\Sigma C_{NBi}$, and "net" is a variable for which an object linked in the net list (netlistA and netlistB) is substituted.

In FIG. 27, the "counter" is cleared to zero (S101). Then, the leading object is retrieved from the netlist "netlistK" (K=A or B) and substituted in the "net" (S102).

Then, it is determined whether or not the "net" is NULL, that is, whether or not all objects have been retrieved from the "netlistJ" (S103). Unless the "net" is NULL (no in S103), the "cellcount$_j$" of the object divided area $D_j$ of the net $NA_1$ set in the cell 1 (the number of cells $C_{N_j\ i}$) is retrieved from the net table 120. The retrieved value is substituted for the function f ($C_{N_j\ i}$), and the function is added to the "counter" (S104). Then, the next object is retrieved from the "netlistJ" and substituted for the "net" (S105), and control is returned again to step S103.

As described above, the processes in steps S104 through S105 are repeated until it is determined in step S103 that the "net" is NULL (yes in step S103).

As a result, after performing the processes according to the flowchart shown in FIG. 27, the counter is set to the values of the costs $CosT_a$ and $CosT_b$ computed by the above listed equations (9) and (10). The mini-cut method is performed while substituting the values of the costs $CosT_a$ and $CosT_b$ in the equation (6).

Described below is the practical operations of the fourth initial array determining apparatus 40.

Figure 28:
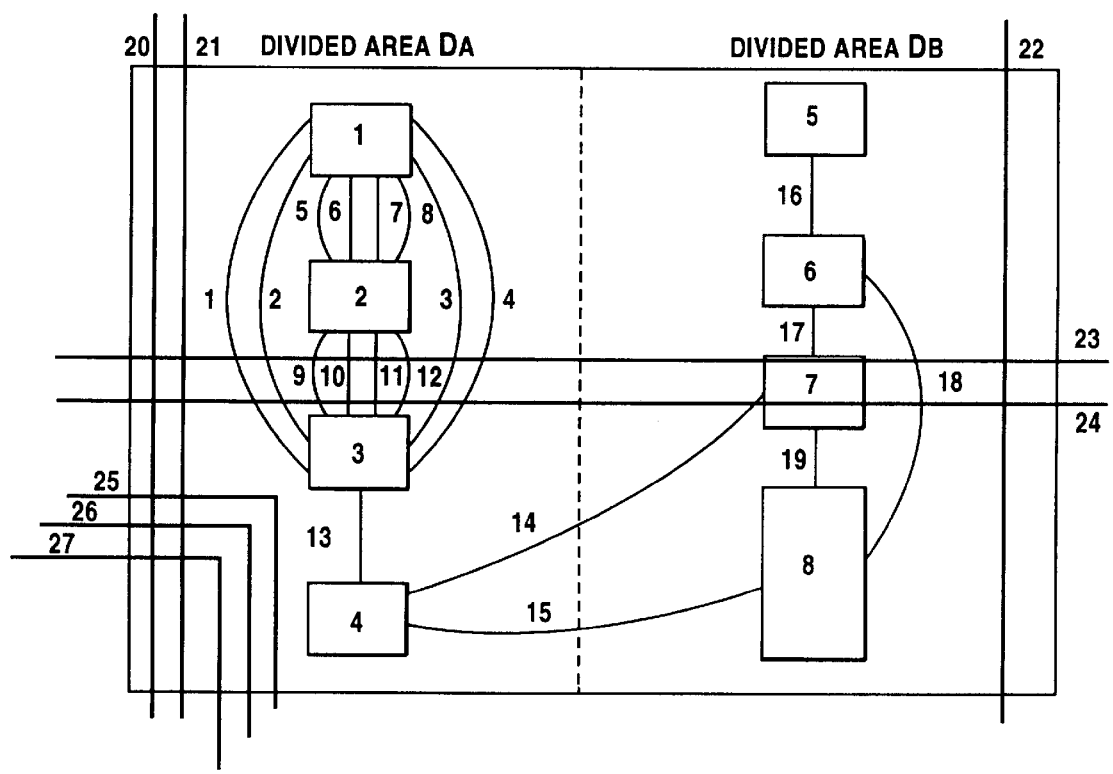
FIG. 28 shows the result of the general line connection for the circuit shown in FIG. 16 by the mini-cut method according to the fourth initial array determining apparatus of the present invention.

FIG. 28 shows the result of the global routing of the area 100 shown in FIG. 16.

Assume that the eight global nets having the net numbers 20 through 27 pass through the divided areas $D_A$ and $D_B$ as shown in FIG. 28.

FIGS. 29A and 29B respectively show the structures of the data of the global net lists for storing the information about the global nets shown in FIG. 28 for the divided areas $D_A$ and $D_B$.

FIG. 29A shows the data structure of the global net list "globalA" with the global nets passing through the divided area $D_A$. The seven global nets 20 through 27 having the net numbers 20, 21, and 23 through 27 are linked.

FIG. 29B shows the data structure of the global net list "globalB" with the global nets passing through the divided area $D_B$. The three global nets 22 through 24 having the net numbers 22 through 24 are linked.

Figure 30:
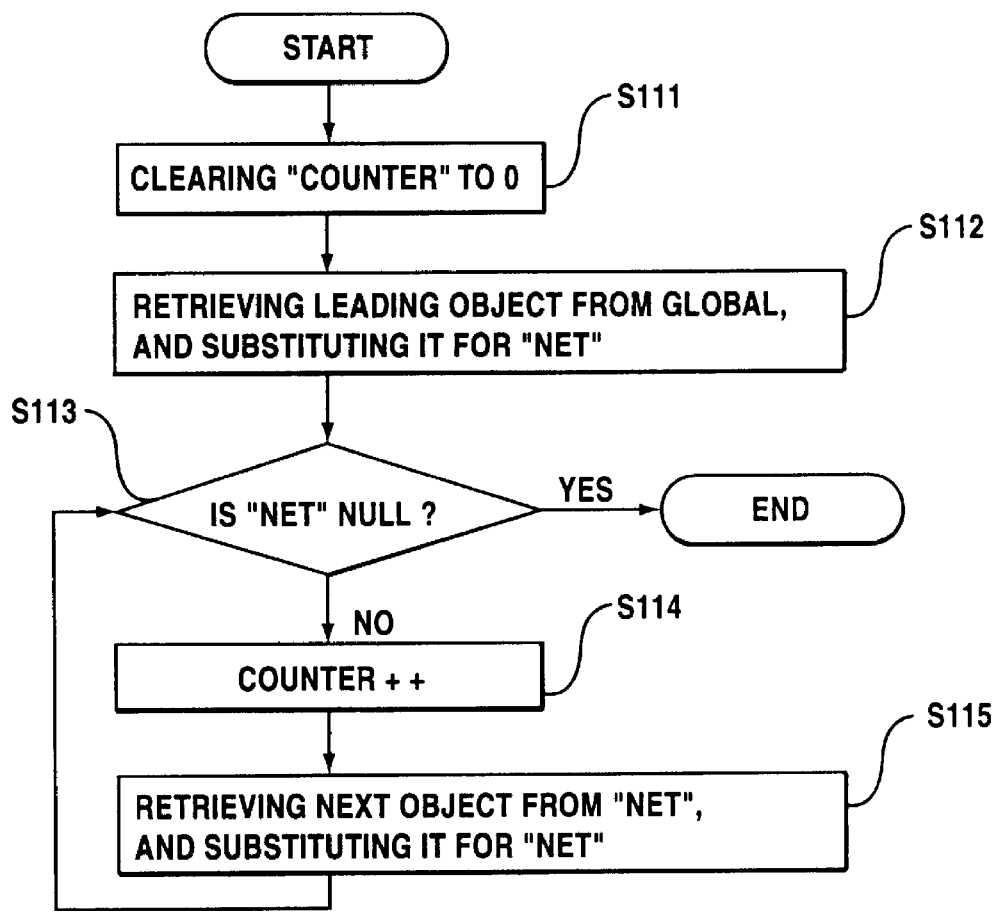
FIG. 30 is an operating flowchart showing the process of obtaining the number of general connection lines in the divided areas $D_A$ and $D_B$ shown in FIG. 28 in the mini-cut method using the above described fourth initial array determining apparatus.

FIG. 30 is an operating flowchart showing the process of obtaining the $TN_a$ and $TN_b$ in the above described equation (12) by referring to the global net lists "globalA" and "globalB".

In FIG. 30, the "counter" is a variable for use in counting $TN_a$ and $TN_b$, and the net is a variable for which an object linked in the global net list (globalA and globalB) is substituted.

In FIG. 30, the "counter" is cleared to zero (S111). Then, the leading object is retrieved from globalA or globalB and substituted in the "net" (S112).

Then, it is determined whether or not the "net" is NULL, that is, whether or not all objects have been retrieved from globalA or globalB (S113). Unless the "net" is NULL (no in S113), the counter is incremented by 1 (S114). Then, the next object is retrieved from the globalA or globalB and substituted in the "net" (S115), and control is returned to step S113.

As described above, the processes in steps S114 and S115 are repeated until it is determined in step S113 that the "net" is NULL (yes in S113). As a result, the process in FIG. 30 is performed on the globalA and globalB, and the counter stores the sums $TN_a$ and $TN_b$ of the global nets passing through the divided areas $D_A$ and $D_B$. That is, the values 7 and 3 are obtained as the sums $TN_a$ and $TN_b$ respectively of the global nets.

Thus, the mini-cut method is performed while substituting the $TN_a$ and $TN_b$ in the above described equation (12) representing the restrictive condition.

As described above, according to the present invention, since the cells are arrayed in a way that the net congestion and terminal density can be dispersed in the areas divided by cut lines in performing the mini-cut method, the connection rate can be successfully improved.

Figure 31:
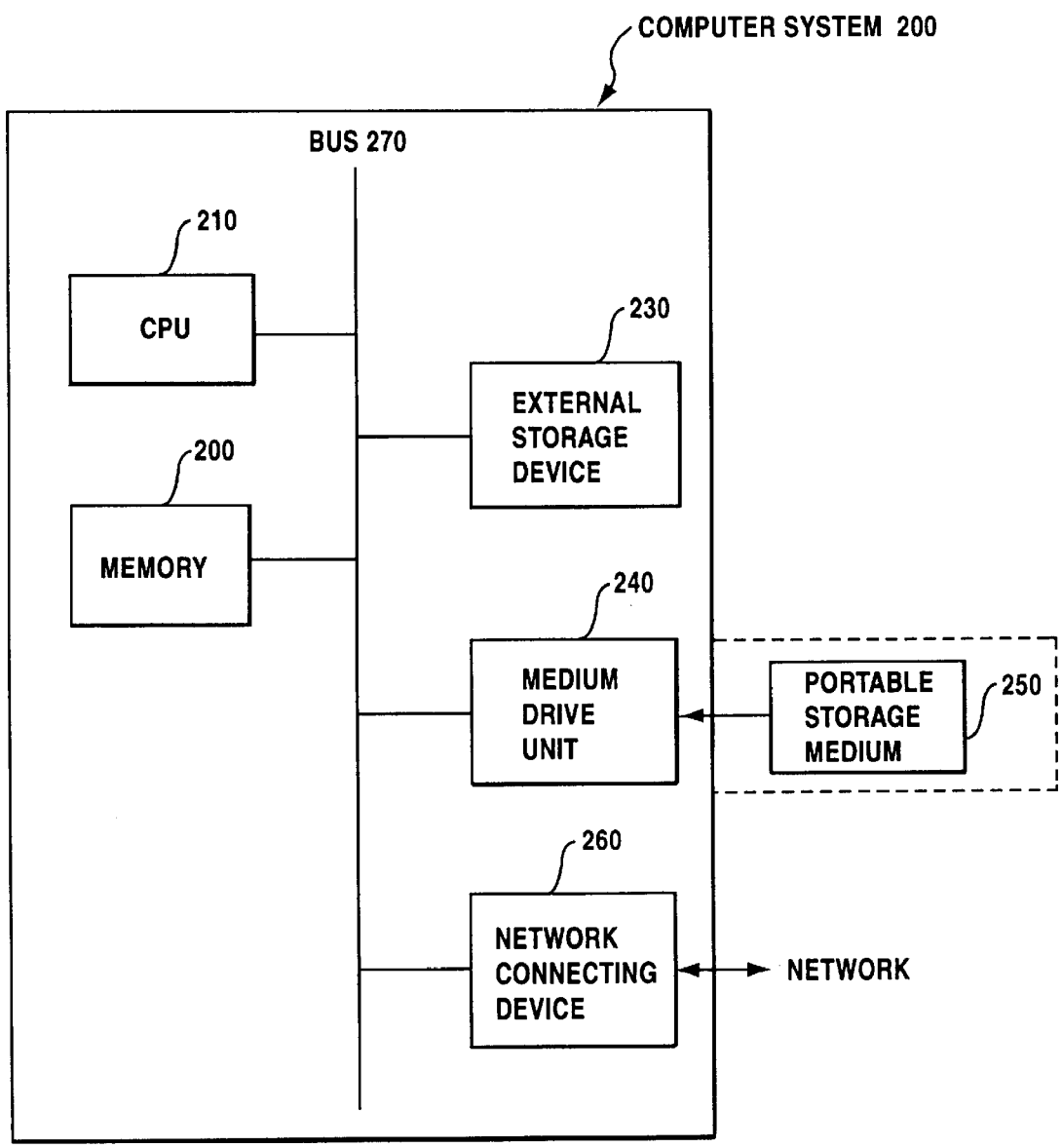
FIG. 31 shows an architecture of the computer system to which the initial array determining apparatus according to the present invention is applied.

FIG. 31 shows an architecture of the computer system to which the initial array determining apparatus according to the present invention is applied.

In FIG. 31, a computer system 200 comprises a CPU 210, a memory 220, an external storage device 230, a medium drive unit 240, a portable storage medium 250, and a network connecting device 260. These components are interconnected via a bus 270.

The CPU 210 reads, for example, a program, etc. stored on the external storage device 230 or portable storage medium 250, and performs various processes according to the program.

The memory 220 is, for example, a RAM.

The external storage device 230 is, for example, an HDD storing an OS, various applications programs, data, etc.

The medium drive unit 240 is, for example, an FDD, a CD-ROM drive unit, and an MO drive unit, and reads a program, data, etc. stored on the portable storage medium 250 that can be, for example, an FD, a CD-ROM, an MO, etc.

The portable storage medium 250 is, for example, an FD, a CD-ROM, an MO, etc. and electromagnetically and optically stores applications programs, data, etc.

The network connecting device 260 comprises, for example, a modem, etc. and transmits and receives data to and from other information processing devices through an external network (for example, ISDN, Internet, etc.).

The initial array determining apparatus according to the present invention can also be designed to read an applications program stored on the external storage device 230 or portable storage medium 250, or externally received through the network connecting device 260, and to execute the program through the CPU 210.

What is claimed is:

1. An apparatus for determining an initial array of cells forming an integrated circuit by setting a cut line in an area of the integrated circuit and repeating an operation of shifting the cells in areas divided by the cut line in a way that a number of cuts indicating a number of connection lines cut by the cut line is minimized, comprising:

cell size computing means for computing sums $C_a$ and $C_b$ of sizes of the cells contained respectively in areas $D_A$ and $D_B$ divided by the cut line;

net cell size computing means for obtaining sums of nets contained respectively in the areas $D_A$ and $D_B$ divided by the cut line and outputting the sums as net cell sizes $N_a$ and $N_b$; and mini-cut method executing means for performing a mini-cut method based on computation results from said cell size computing means and said net cell size computer means under a restrictive condition that a respective total of cell size sums and the net cell sizes is balanced between the areas $D_A$ and $D_B$.

2. The apparatus according to claim 1, wherein said mini-cut method executing means comprises:

average feedthrough area computing means for computing an average feedthrough area $\theta$ of the area divided by the cut line;

area size computing means for computing area sizes A and B of the two divided areas $D_A$ and $D_B$; and executing means for performing, based on computing results from said area size computing means, said average feedthrough area computing means, said cell size computing means, and said net cell size computing means, the mini-cut method in a way that a restrictive condition represented by an equation (1)

$$\left|\frac{C_a + \theta \cdot N_a}{A} - \frac{C_b + \theta \cdot N_b}{B}\right| \leq \epsilon \tag{1}$$

where $\in$ indicates a value extremely smaller than a sum of the area sizes A and B of the two divided area sizes $D_A$ and $D_B$ can be satisfied.

3. The apparatus according to claim 2, wherein said average feedthrough area size computing means computes a use rate $\gamma$ of the area size divided by the cut line by equation (2), and computes the average feedthrough area size $\theta$ by equation (3)

$$\gamma = \frac{C_a + C_b}{A + B} \tag{2}$$

$$\theta = \frac{\lambda(1-\gamma)(A+B)}{N_{all}} \tag{3}$$

where $N_{all} = N_a + N_b - N_{cut}$, and $N_{cut}$ indicates a number of nets cut by the cut line, and $\lambda$ indicates an effective feedthrough use rate.

4. The apparatus according to claim 3, wherein said effective feedthrough use rate $\lambda$ is in a range from 0.7 to 0.85.

5. An apparatus for determining an initial array of cells forming an integrated circuit by setting a cut line in an area of the integrated circuit and repeating an operation of shifting the cells in areas divided by the cut line in a way that number of cuts indicating a number of connection lines cut by the cut line is minimized, comprising:

cell size computing means for computing sums $C_a$ and $C_b$ of sizes of the cells contained respectively in areas $D_A$ and $D_B$ divided by the cut line;

terminal cell size computer means for obtaining sums of terminals of all cells contained respectively in the areas $D_A$ and $D_B$ divided by the cut line and outputting the sums as terminal cell sizes $P_a$ and $P_b$; and mini-cut method executing means for performing a mini-cut method based on computation results from said cell size computing means and said terminal cell size computing means under a restrictive condition that a respective total of cell size sums and the terminal cell sizes is balanced between the areas $D_A$ an $D_B$.

6. The apparatus according to claim 5, wherein said mini-cut method executing means comprises:

area size computing means for computing area sizes A and B of the two divided area sizes $D_A$ and $D_B$; and executing means for performing, based on computing results from said area size computing means, the mini-cut method in a way that a restrictive condition represented by an equation (5)

$$\left|\frac{C_a + \alpha \cdot P_a}{A} - \frac{C_b + \alpha \cdot P_b}{B}\right| \leq \epsilon \tag{5}$$

(where $\in$ indicates a value extremely smaller than a sum of the area sizes A and B of the two divided areas $D_A$ and $D_B$, and $\alpha$ indicates a weight of terminal congestion) can be satisfied.

7. The apparatus according to claim 6, wherein $\alpha$ is in a range from 0.1 to 10.

8. An apparatus for determining an initial array of cells forming an integrated circuit by setting a cut line in an area of the integrated circuit and repeating an operation of shifting the cells in areas divided by the cut line in a way that a number of cuts indicating a number of connection lines cut by the cut line is minimized, comprising:

cell size computing means for computing sums $C_a$ and $C_b$ of sizes of the cells contained respectively in areas $D_A$ and $D_B$ divided by the cut line;

cost computing means for computing congestion costs $CosT_a$ and $CosT_b$ of the nets contained respectively in areas $D_A$ and $D_B$ divided by the cut line; and mini-cut method executing means for performing a mini-cut method based on computation results from said cost computing means and said cell size computing means under a restrictive condition that a respective total of cell size sums and the congestion costs of the nets is balanced between the areas $D_A$ and $D_B$.

9. The apparatus according to claim 8, wherein said mini-cut method executing means comprises:

average feedthrough area computing means for computing an average feedthrough area θ of the area divided by the cut line; and executing means for performing the mini-cut method in a way that a restrictive condition represented by an equation (6)

$$\frac{C_a + \theta \cdot \text{Cos}T_a}{A} - \frac{C_b + \theta \cdot \text{Cos}T_b}{B} \leq \epsilon \tag{6}$$

where $\in$ indicates a value extremely smaller than a sum of the area sizes A and B of the two divided areas $D_A$ and $D_B$ can be satisfied.

10. The apparatus according to claim 9, wherein said average feedthrough area computing means computes a use rate γ of the area divided by the cut line by equation (2), and computes the average feedthrough area θ by equation (3)

$$\gamma = \frac{C_a + C_b}{A + B} \tag{2}$$

$$\theta = \frac{\lambda(1 - \gamma)(A + B)}{N_{all}} \tag{3}$$

where $N_{all} = N_a + N_b - N_{cut}$, and $N_{cut}$ indicates a number of nets cut by the cut line.

11. The apparatus according to claim 9, wherein said cost computing means computes the costs $\text{Cos}T_a$ and $\text{Cos}T_b$ respectively by equations (9) and (10)

$$\text{Cos}T_a = \sum_{i=1}^{N_a} f(C_{NAi}) \tag{9}$$

$$\text{Cos}T_b = \sum_{i=1}^{N_a} f(C_{NBi}) \tag{10}$$

when $C_{NAi}$ cells are contained in a divided area $D_A$ and connected to nets $NA_i$ (i=1, 2, ..., $N_a$) also contained in the divided area $D_A$, and $C_{NBi}$ cells are contained in a divided area $D_B$ and connected to nets $NB_i$ (i=1, 2, ..., $N_b$) also contained in the divided area $D_B$.

12. The apparatus according to claim 11, wherein a function f(x) in said equations (9) and (10) is defined as:

$$f(x) = \log x$$

where $x = C_{NAi}, C_{NBi}$.

13. The apparatus according to claim 11, wherein a function f(x) in said equations (9) and (10) is defined as:

$$f(x) = x$$

where $x = C_{NAi}, C_{NBi}$.

14. An apparatus for determining an initial array of cells forming an integrated circuit by setting a cut line in an area of the integrated circuit and repeating an operation of shifting the cells in areas divided by the cut line in a way that a number of cuts indicating a number of connection lines cut by the cut line is minimized, comprising:

global routing means for routing global nets;

global net number computing means for computing numbers $TN_a$ and $TN_b$ of global nets passing through divided areas $D_A$ and $D_B$ based on a global routing result obtained by said global routing means;

net number computing means for computing sums $N_a$ and $N_b$ of nets contained respectively in areas $D_A$ and $D_B$ divided by the cut line;

net cell size computing means for computing net cell sizes of two divided areas $D_A$ and $D_B$ based on computation results from said net number computing means and said global net number computing means;

cell size computing means for computing sums $C_a$ and $C_b$ of sizes of the cells contained respectively in the areas $D_A$ and $D_B$ divided by the cut line; and mini-cut method executing means for performing a mini-cut method on said divided areas $D_A$ and $D_B$ under a restrictive condition that a respective total of cell size sums computed by said cell size computing means and the net cell sizes computed by said net cell size computing means is balanced.

15. The apparatus according to claim 14, wherein said net cell size computing means obtains $N_a + TN_a$ and $N_b + TN_b$ respectively as the net cell sizes of the divided areas $D_A$ and $D_B$.

16. The apparatus according to claim 15, wherein said mini-cut method executing means comprises:

average feedthrough area computing means for computing an average feedthrough area θ of the area divided by the cut line;

area size computing means for computing area sizes A and B of the two divided areas $D_A$ and $D_B$; and executing means for performing, based on computing results from said area size computing means and said average feedthrough area computing means, the mini-cut method in a way that a restrictive condition represented by an equation (12)

$$\frac{C_a + \theta \cdot (N_a + TN_a)}{A} - \frac{C_b + \theta \cdot (N_b + TN_b)}{B} \leq \epsilon \tag{12}$$

where $\in$ indicates a value extremely smaller than a sum of the area sizes A and B of the two divided areas $D_A$ and $D_B$ can be satisfied.

17. The apparatus according to claim 16, wherein said average feedthrough area computing means computes a use rate γ of the area divided by the cut line by equation (2), and computes the average feedthrough area θ by equation (3)

$$\gamma = \frac{C_a + C_b}{A + B} \tag{2}$$

$$\theta = \frac{\lambda(1 - \gamma)(A + B)}{N_{all}} \tag{3}$$

where $N_{all} = N_a + N_b - N_{cut}$, and $N_{cut}$ indicates a number of nets cut by the cut line, and λ indicates an effective feedthrough use rate.

18. An apparatus for determining an initial array of cells forming an integrated circuit by setting a cut line in an area of the integrated circuit and repeating an operation of shifting the cells in areas divided by the cut line in a way that a number of cuts indicating an umber of connection lines cut by the cut line is minimized, comprising:

cell size computing means for computing sums $C_a$ and $C_b$ of sizes of the cells contained respectively in areas $D_A$ and $D_B$ divided by the cut line;

net cell size computing means for obtaining sums of nets contained respectively in the areas $D_A$ and $D_B$ divided by the cut line and outputting the sums as net cell sizes $N_a$ and $N_b$;

terminal cell size computing means for obtaining sums of terminals of all cells contained respectively in the areas $D_A$ an $D_B$ divided by the cut line and outputting the sums as terminal cell sizes $P_a$ and $P_b$; and mini-cut method executing means for performing a mini-cut method based on computation results from said cell size computing means, said net cell size computing means, and said terminal cell size computing means under a restrictive condition that a respective total of the cell size sums and the terminal cell sizes are both balanced between the areas $D_A$ and $D_B$.

19. An apparatus for determining an initial array of cells forming an integrated circuit by setting a cut line in an area of the integrated circuit and repeating an operation of shifting the cells in areas divided by the cut line in a way that a number of cuts indicating a number of connection lines cut by the cut line is minimized, comprising:

cell size computing means for computing sums $C_a$ and $C_b$ of sizes of the cells contained respectively in areas $D_A$ and $D_B$ divided by the cut line;

cost computing means for computing congestion costs $CosT_a$ and $CosT_b$ of nets contained respectively in areas $D_A$ and $D_B$ divided by the cut line;

terminal cell size computing means for obtaining sums of terminals of all cells contained respectively in the areas $D_A$ and $D_B$ divided by the cut line and outputting the sums as terminal cell sizes $P_a$ and $P_b$; and mini-cut method executing means for performing a mini-cut method based on computation results from said cell size computing means, said cost computing means, and said terminal cell size computing means under a restrictive condition that a respective total of cell size sums and the net congestion costs, and a respective total of the cell size sums and the terminal cell sizes are both well balanced for two divided areas $D_A$ and $D_B$.

20. An apparatus for determining an initial array of cells forming an integrated circuit by setting a cut line in an area of the integrated circuit and repeating an operation of shifting the cells in areas divided by the cut line in a way that a number of cuts indicating a number of connection lines cut by the cut line is minimized, comprising:

global routing means for routing global nets;

global net number computing means for computing numbers $TN_a$ and $TN_b$ of global nets passing through divided areas $D_A$ and $D_B$ based on a global routing result obtained by said global routing means;

net number computing means for computing sums $N_a$ and $N_b$ of nets contained respectively in areas $D_A$ and $D_B$ divided by the cut line;

net cell size computing means for computing net cell sizes of two divided areas $D_A$ and $D_B$ based on computation results from said net number computing means and said global net number computing means;

cell size computing means for computing sums $C_a$ and $C_b$ of sizes of the cells contained respectively in the areas $D_A$ and $D_B$ divided by the cut line;

cost computing means for computing congestion costs $CosT_a$ and $CosT_b$ of nets contained respectively in areas $D_A$ and $D_B$ divided by the cut line; and mini-cut method executing means for performing a mini-cut method based on computation results from said cell size computing means, said cost computing means, and said net cell size computing means under a restrictive condition that a respective total of cell size sums and the congestion costs, and a respective total of the cell size sums and the net cell sizes are both balanced between the areas $D_A$ and $D_B$.

21. An apparatus for determining an initial array of cells forming an integrated circuit by setting a cut line in an area of the integrated circuit and repeating an operation of shifting the cells in areas divided by the cut line in a way that a number of cuts indicating a number of connection lines cut by the cut line is minimized, comprising:

global routing means for routing global nets;

global net number computing means for computing number $TN_a$ and $TN_b$ of global nets passing through divided areas $D_A$ and $D_B$ based on a global routing result obtained by said global routing means;

net number computing means for computing sums $N_a$ and $N_b$ of nets contained respectively in areas $D_A$ and $D_B$ divided by the cut line;

net cell size computing means for computing net cell sizes of two divided areas $D_A$ and $D_B$ based on computation results from said net number computing means and said global net number computing means;

cell size computing means for computing sums $C_a$ and $C_b$ of sizes of the cells contained respectively in the areas $D_A$ and $D_B$ divided by the cut line;

terminal cell size computing means for obtaining sums of terminals of all cells contained respectively in the areas $D_A$ and $D_B$ divided by the cut line and outputting the sums as terminal cell sizes $P_a$ and $P_b$;

cost computing means for computing congestion costs $CosT_a$ and $CosT_b$ of nets contained respectively in areas $D_A$ and $D_B$ divided by the cut line; and mini-cut methods executing means for performing a mini-cut method under a restrictive condition that a respective total of cell size sums and the terminal cell sizes is balanced between the areas $D_A$ and $D_B$ based on computation results from said cell size computing means and said terminal cell size computing means; under a restrictive condition that a respective total of the cell sizes and the net congestion costs is balanced between the areas $D_A$ and $D_B$ based on computation results from said cell size computing means and said cost computing means; and under a restrictive condition that a respective total of the cell size sums and the net cell sizes is balanced between the areas $D_A$ and $D_B$ based on computation results from said cell size computing means and said net cell size computing means.

22. A method for determining an initial array of cells forming an integrated circuit by setting a cut line in an area of the integrated circuit and repeating an operation of shifting the cells in areas divided by the cut line in a way that a number of cuts indicating a number of connection lines cut by the cut line is minimized, comprising the steps of:

computing sums of sizes of the cells contained in areas divided by the cut line;

obtaining sums of nets contained in the areas divided by the cut line and outputting the sums as net cell sizes; and performing a mini-cut method based on computed cell size sums and net cell sizes under a restrictive condition that the cells and nets are balanced between the divided areas.

23. A method for determining an initial array of cells forming an integrated circuit by setting a cut line in an area of the integrated circuit and repeating an operation of shifting the cells in areas divided by the cut line in a way that a number of cuts indicating a number of connection lines cut by the cut line is minimized, comprising the steps of:

computing sums of sizes of the cells contained in areas divided by the cut line;

obtaining sums of all cell terminals contained in the areas divided by the cut line and outputting the sums as terminal cell sizes; and performing a mini-cut method based on computed cell size sums and terminal cell sizes in the divided areas under a restrictive condition that the cells and terminals are balanced between the divided areas.

24. A method for determining an initial array of cells forming an integrated circuit by setting a cut line in an area of the integrated circuit and repeating an operation of shifting the cells in areas divided by the cut line in a way that a number of cuts indicating a number of connection lines cut by the cut line is minimized, comprising the steps of:

computing sums of sizes of the cells contained in areas divided by the cut line;

obtaining sums of net congestion costs contained in the areas divided by the cut line; and performing a mini-cut method based on computed cell size sums and net congestion costs under a restrictive condition that the cells and nets are balanced the divided areas.

25. A method for determining an initial array of cells forming an integrated circuit by setting a cut line in an area of the integrated circuit and repeating an operation of shifting the cells in areas divided by the cut line in a way that a number of cuts indicating a number of connection lines cut by the cut line is minimized, comprising the steps of:

routing global nets;

computing numbers of the global nets passing through areas divided by the cut line;

computing sums of nets contained in the areas;

computing net cell sizes of the divided areas based on computed number of the global nets and sums of nets;

computing sums of sizes of the cells contained in the divided areas; and performing a mini-cut method based on computed cell size sums and net cell sizes under a restrictive condition that the cells and nets are balanced between the divided areas in consideration of the general connection lines.

26. A computer-readable storage medium used to direct a computer for determining an initial cell array of an integrated circuit to perform the functions of:

computing sums of sizes of the cells contained in areas divided by the cut line;

obtaining sums of nets contained in the areas divided by the cut line and outputting the sums as net cell sizes; and performing a mini-cut method based on computed cell size sums and net cell sizes under a restrictive condition that the cells and nets are balanced between the divided areas.

27. An article of manufacture for use in an information processing system for determining an initial cell array of an integrated circuit, comprising:

a storage medium for use by a computer for storing a computer-readable program code, wherein said program code comprises:

computer-readable program coding means for computing sums of sizes of the cells contained in areas divided by the cut line;

computer-readable program coding means for obtaining sums of nets contained in the areas divided by the cut line and outputting the sums as net cell sizes; and computer-readable program coding means for performing a mini-cut method based on computed cell size sums and net cell sizes under a restrictive condition that the cells and nets are balanced the divided areas.

* * * * *